(12) United States Patent
Moore

(10) Patent No.: US 7,183,788 B2
(45) Date of Patent: *Feb. 27, 2007

(54) WIRELESS RADIO FREQUENCY TECHNIQUE DESIGN AND METHOD FOR TESTING OF INTEGRATED CIRCUITS AND WAFERS

(75) Inventor: Brian Moore, Edmonton (CA)

(73) Assignee: Scanimetrics Inc., Edmonton (CA)

( * ) Notice: Subject to any disclaimer, the term of this patent is extended or adjusted under 35 U.S.C. 154(b) by 26 days.

This patent is subject to a terminal disclaimer.

(21) Appl. No.: 10/788,491

(22) Filed: Mar. 1, 2004

(65) Prior Publication Data

US 2004/0164760 A1    Aug. 26, 2004

Related U.S. Application Data

(63) Continuation of application No. 09/854,905, filed on May 15, 2001, now Pat. No. 6,759,863.

(30) Foreign Application Priority Data

May 15, 2000    (CA)    ..................... 2308820

(51) Int. Cl.
*G01R 31/26* (2006.01)
(52) U.S. Cl. ..................... 324/765; 324/763
(58) Field of Classification Search ................ 324/765, 324/763, 754, 158.1; 327/161, 269, 261, 327/262; 254/8, 4
See application file for complete search history.

(56) References Cited

U.S. PATENT DOCUMENTS 3,689,885 A    9/1972    Kaplan et al.
4,002,974 A    1/1977    Thomas
4,105,950 A    8/1978    Dingwall
4,392,105 A    7/1983    McLeod
4,517,532 A    5/1985    Neidorff
4,587,480 A    5/1986    Zasio
4,985,681 A    1/1991    Brunner et al.
5,030,908 A    7/1991    Miyoshi et al.

(Continued)

FOREIGN PATENT DOCUMENTS

EP    0 098 399 B1    6/1986

(Continued)

OTHER PUBLICATIONS

Arabi, K. et al. "Digital Oscillation-Test Method for Delay and Stuck-At-Fault Testing of Digital Circuits", International Test Conference, 1998, pp. 91-100.

(Continued)

*Primary Examiner*—Minh N. Tang
(74) *Attorney, Agent, or Firm*—Bereskin & Parr

(57) ABSTRACT

The present invention is for an apparatus and method for the wireless testing of Integrated Circuits and wafers. The apparatus comprises a test unit external from the wafer and at least one test circuit which is fabricated on the wafer which contains the Integrated Circuit. The test unit transmits an RF signal to power the test circuit. The test circuit, comprising a variable ring oscillator, performs a series of parametric tests at the normal operating frequency of the Integrated Circuit and transmits the test results to the test unit for analysis.

19 Claims, 22 Drawing Sheets

U.S. PATENT DOCUMENTS

| | | | |
|---|---|---|---|
| 5,039,602 A * | 8/1991 | Merrill et al. ................ | 438/11 |
| 5,059,899 A | 10/1991 | Farnworth et al. | |
| 5,068,521 A | 11/1991 | Yamaguchi | |
| 5,095,267 A | 3/1992 | Merrill et al. | |
| 5,113,184 A | 5/1992 | Katayama | |
| 5,149,662 A | 9/1992 | Eichelberger | |
| 5,192,913 A | 3/1993 | Goruganthu et al. | |
| 5,204,559 A | 4/1993 | Deyhimy et al. | |
| 5,248,936 A | 9/1993 | Nakata et al. | |
| 5,252,914 A | 10/1993 | Bobbitt et al. | |
| 5,266,890 A | 11/1993 | Kumbasar et al. | |
| 5,279,975 A | 1/1994 | Devereaux et al. | |
| 5,315,241 A | 5/1994 | Ewers | |
| 5,365,204 A | 11/1994 | Angiulli et al. | |
| 5,446,395 A | 8/1995 | Goto | |
| 5,457,400 A | 10/1995 | Ahmad et al. | |
| 5,619,463 A | 4/1997 | Malhi | |
| 5,625,288 A | 4/1997 | Snyder et al. | |
| 5,686,855 A * | 11/1997 | Lee ........................... | 327/378 |
| 5,714,888 A | 2/1998 | Naujoks | |
| 5,754,081 A * | 5/1998 | Kuroiwa et al. ............ | 331/49 |
| 5,790,479 A | 8/1998 | Conn | |
| 5,811,983 A | 9/1998 | Lundberg | |
| 5,818,250 A | 10/1998 | Yeung et al. | |
| 5,867,033 A | 2/1999 | Sporck et al. | |
| 5,892,368 A | 4/1999 | Nakata et al. | |
| 5,905,383 A | 5/1999 | Frisch | |
| 5,923,676 A | 7/1999 | Sunter et al. | |
| 5,952,840 A | 9/1999 | Farnworth et al. | |
| 5,963,043 A | 10/1999 | Nassif | |
| 5,983,363 A | 11/1999 | Tuttle et al. | |
| 5,994,915 A | 11/1999 | Farnworth et al. | |
| 5,995,428 A | 11/1999 | Chien et al. | |
| 5,999,009 A | 12/1999 | Mitsui | |
| 6,005,407 A | 12/1999 | Arabi et al. | |
| 6,005,829 A | 12/1999 | Conn | |
| 6,057,699 A | 5/2000 | Yin et al. | |
| 6,058,497 A | 5/2000 | Tuttle | |
| 6,069,849 A | 5/2000 | Kingsley et al. | |
| 6,075,417 A | 6/2000 | Cheek et al. | |
| 6,087,842 A | 7/2000 | Parker et al. | |
| 6,097,203 A | 8/2000 | Parker et al. | |
| 6,119,255 A | 9/2000 | Akram | |
| 6,133,582 A | 10/2000 | Osann, Jr. et al. | |
| 6,134,191 A | 10/2000 | Alfke | |
| 6,161,205 A | 12/2000 | Tuttle | |
| 6,166,607 A | 12/2000 | Schoellkopf | |
| 6,169,694 B1 | 1/2001 | Nam et al. | |
| 6,184,696 B1 | 2/2001 | White et al. | |
| 6,189,120 B1 | 2/2001 | Akram | |
| 6,219,305 B1 | 4/2001 | Patrie et al. | |
| 6,223,314 B1 | 4/2001 | Arabi et al. | |
| 6,236,223 B1 | 5/2001 | Brady et al. | |
| 6,239,591 B1 | 5/2001 | Bryant et al. | |
| 6,239,603 B1 | 5/2001 | Ukei et al. | |
| 6,356,514 B1 | 3/2002 | Wells et al. | |
| 6,430,720 B1 * | 8/2002 | Frey et al. .................. | 714/744 |
| 6,466,520 B1 | 10/2002 | Speyer et al. | |
| 6,512,392 B2 | 1/2003 | Fleury et al. | |
| 6,535,009 B1 * | 3/2003 | Pochmuller ................ | 324/760 |
| 6,538,936 B2 | 3/2003 | Tanaka et al. | |
| 6,544,807 B1 | 4/2003 | Bach | |
| 6,693,434 B2 * | 2/2004 | Chetlur et al. ............. | 324/520 |
| 6,759,863 B2 * | 7/2004 | Moore ........................ | 324/765 |
| 6,882,239 B2 | 4/2005 | Miller | |
| 2001/0005145 A1 | 6/2001 | White et al. | |
| 2005/0156755 A1 | 7/2005 | Miller | |

FOREIGN PATENT DOCUMENTS

| | | |
|---|---|---|
| EP | 0 651 505 A1 | 5/1995 |
| EP | 0 702 238 A1 | 3/1996 |
| EP | 0 911 640 A2 | 4/1999 |
| WO | WO 97/15838 | 5/1997 |
| WO | WO 99/16107 | 4/1999 |
| WO | WO 99/17353 | 4/1999 |
| WO | WO 99/32893 | 7/1999 |
| WO | WO 99/65287 | 12/1999 |

OTHER PUBLICATIONS

Fernald, Kenneth W. et al, A Self-Tuning Digital Telemetry IC for Use in a Microprocessor-Based Implantable Instrument—IEEE Journal of Solid-State Curcuits—vol. 27, No. 12 (Dec. 1992)—pp. 1826-1832.

Kang, Sung-Mo (Steve) & Yusuf Leblebici, CMOS Digital Integrated Circuits—1999—pp. 220-242, Chaps 6, 9, 11, 15.

Schroder, Dieter K., Semiconductor Material and Device Characterization—1990—pp. 1-40.

Stevens, Anthony K. Introduction to Component Testing—1986—pp. 3-14 & pp. 91-119.

Zorian, Yervant, "Testing the Monster Chip"—IEEE Spectrum, (Jul. 1999)—pp. 54-60.

* cited by examiner

WIRELESS RADIO FREQUENCY TECHNIQUE DESIGN AND METHOD FOR TESTING OF INTEGRATED CIRCUITS AND WAFERS

This application is a continuation of prior application Ser. No. 09/854,905, filed May 15, 2001, now U.S. Pat. No. 6,759,863 the entirety of which is hereby incorporated by reference.

FIELD OF THE INVENTION

The present invention relates to a method and apparatus for the testing of wafers during the IC fabrication process and more particularly to a method and apparatus for the wireless testing of ICs on wafers.

BACKGROUND OF THE INVENTION

In the Integrated Circuit (IC) manufacturing process, a plurality of ICs are formed upon the surface of a circular wafer by the successive deposition of various materials such as metal and oxide layers according to a design layout. After all of the layers have been deposited, the wafer is diced into separate ICs that are then packaged for sale. For quality assurance purposes and for evaluating the manufacturing process, the ICs are tested for proper operation before they are packaged for sale. However, if it could be determined before dicing and packaging that a defect had occurred in a particular IC, or in the manufacturing process, then substantial cost savings could be achieved by discarding the damaged IC before it is packaged or by discarding the entire wafer before it is diced and making corrections to the manufacturing process.

Conventional IC testing is done after all of the layers have been deposited on the wafer. Due to imperfections in the manufacturing process, a certain amount of the ICs will be defective. For instance if the probability of a defect occurring during the deposition of a metallization layer is 1% then the probability of having defective ICs after 7 metallization layers have been deposited is 6.8% which is not insignificant since ICs are mass produced in large quantities. This is an investment on the part of the manufacturers that could be mitigated by knowing errors in the manufacturing process before other manufacturing steps are done. Furthermore, because subsequent metallization layers affect the operation of previous metallization layers, it is difficult to ascertain at which point in the manufacturing process the defects occurred. Consequently, IC testing performed before all of the layers have been deposited can provide valuable information that can be used to discover faults in the IC or in the fabrication process. This is especially true for systematic faults such as faulty metal deposition. Test processes that are done before the IC is completed do exist but these tests are done destructively using physical probe contacts or capacitive coupling. Accordingly, none of these testing methods is satisfactory because of their destructive nature.

Current tests that are done once the IC is fabricated involve probing the IC via Input/Output (I/O) pads or special test pads. The results of these tests may disclose problems in the overall manufacturing process that extend to all the ICs which are fabricated, meanwhile operational tests of the ICs themselves may distinguish individual defective ICs that can then be marked for disposal after dicing. The test method comprises powering up the ICs and using the probes to apply appropriate test signals and record the test result signals. The test result signals are then analyzed to insure that the IC is functioning correctly. This method, and other testing methods which make physical contact with the pads of the IC, require accurate placement of the wafer in relation to the probes which can be both an expensive and time-consuming process. Furthermore, physical contact with the wafer may damage the ICs.

Another difficulty with IC testing is that ICs are constantly increasing in density and complexity. This leads to a problem of visibility and accessibility when testing internal circuits within the ICs after the ICs have been fabricated. Furthermore, while the ICs are increasing in density and complexity, the number of I/O pins remains relatively constant or even limited by geometric constraints. This also contributes to difficulty in IC testing since the number of test signals which can be simultaneously sent to the IC is limited by the number of I/O pins. Likewise, the number of resulting test signals which are probed from the IC is limited.

The use of physical contact (i.e. using probes) in IC testing, after ICs have been fabricated, has another limitation in that the frequency of the test signals which are introduced to the IC is limited due to the physical contact. Current frequency limits are approximately 100 MHz. This frequency limitation puts a lower limit on the test time. Furthermore, this frequency limitation means that ICs are tested at only $\frac{1}{10}^{th}$ or $\frac{1}{100}^{th}$ of the clock frequency that is used during IC operation. Consequently, the test results may not accurately reflect how the IC will behave when it operates at its nominal clock frequency. In light of this information, it is becoming increasingly difficult to test or even access certain sub-circuits within the IC using existing test methods. With IC technology approaching 1 V operating levels, new test methods which use inductive coupling or radio frequency transmissions to transmit test data and receive test results are being developed. These tests involve fabricating small test circuits on the IC wafer. However, these test circuits must be small in size to reduce the overhead costs associated with fabricating these test circuits.

Schoellkopf (U.S. Pat. No. 6,166,607) discloses a test method that uses ring oscillators, oscillating at discrete frequencies, as test circuits. These ring oscillators are placed in the cutting path between the dies on the IC wafer. It is not certain how these test circuits are powered or controlled. The test circuits are connected to metallization layers at least two levels above the metallization levels that are used to fabricate the test circuit. In this manner, Schoellkopf is testing the propagation delay properties of the IC and whether the metal interconnects are intact. This test method measures the characteristics of the transistors in the test circuit as well as indirect measurement of the characteristics of the transistors of the adjacent ICs. However, Schoellkopf requires external probes for powering the test circuit. Furthermore, the test circuit does not allow for the measurement of the influence of the interconnection resistance and capacitance on the IC.

To be useful, the IC test method must work over a range of IC technologies (i.e. gate sizes measured in microns) and supply voltage levels. The IC test method, in particular the test circuits that are fabricated on the IC wafer, must therefore be scalable. It would also be beneficial if the test circuit were small in size so as to minimize the impact on chip real estate. Furthermore, since current state of the art ICs operate at very high speeds and have small dimensions, these ICs operate at the edge of analog behavior and conventional digital test methods may be insufficient. Consequently, the IC test method should include characterization circuits to perform parametric IC testing in which certain parameters such as resistance are measured to provide an indication of the integrity of the IC manufacturing process. The parameters are important as they affect the performance of the IC. The IC test method should also test the IC at high speed.

SUMMARY OF THE INVENTION

The present invention comprises a test circuit for testing an integrated circuit on a wafer. The invention further comprises an apparatus using the test circuit for testing an integrated circuit on a wafer. The apparatus comprises:
  a) a test circuit formed on the wafer with the integrated circuit, the test circuit comprising:
    i) a ring oscillator circuit;
    ii) a plurality of sub-circuits coupled to the ring oscillator circuit;
    iii) a control circuit to selectively couple the sub-circuits to the ring oscillator circuit, and
  b) a test unit separate from the wafer, the test unit linked to the test circuit to transmit a signal to activate the test circuit. The test unit, when activated by the test unit, conducts a separate test of the integrated circuit for each sub-circuit selected by the control circuit.

The test conducted by the test circuit is a parametric test wherein the sub-circuits, when coupled to the ring oscillator circuit, change the frequency of oscillation of the ring oscillator circuit. The control circuit comprises a sequencer to selectively couple the sub-circuits to the ring oscillator circuit to produce a series of test states.

The test unit transmits a power signal (i.e. an RF power signal) that is sufficient to energize the test circuit.

The test circuit further includes at least one sub-circuit comprising a capacitive load to change the frequency of oscillation of the ring oscillator circuit. The capacitive load comprises at least one capacitor.

The test circuit further includes at least one sub-circuit comprising a capacitive load and a resistive load to change the frequency of oscillation of the ring oscillator circuit. The capacitive load comprises at least one capacitor and the resistive load comprises at least one resistor.

The test circuit further includes at least one sub-circuit comprising a delay element to change the frequency of oscillation of the ring oscillator circuit. The delay element may be at least one inverter wherein the inverter is a standard CMOS inverter.

The test circuit may be formed on the wafer with at least two metallization layers of the integrated circuit. Alternatively, the test circuit may be formed on the wafer with at least one metallization layer and one polysilicon layer of the integrated circuit.

The test circuit further comprises a transmitter circuit to transmit the test result signal from the test circuit to the test unit. The test result signal is the output of the ring oscillator circuit. Accordingly, the test unit comprises a receiver circuit to receive the test result signal from the test circuit. The test unit further comprises a circuit to analyze and display the test result signal. The analyzing circuit calculates a value of the parameter being tested. The analyzing circuit may also calculate a ratio of the values of the parameters being tested.

The test circuit further comprises an antenna adapted to receive the signal from the test unit and a power supply circuit coupled to the antenna and adapted to provide power to the test circuit. The power supply circuit comprises a voltage rectifier coupled to the antenna, a voltage regulator coupled to the voltage rectifier and an energy storage element coupled to the voltage regulator, wherein the power supply circuit is adapted to provide a plurality of voltage levels to the test circuit.

The control circuit in the test circuit further comprises a second ring oscillator adapted to provide a first clock signal, and a divider coupled to the second ring oscillator and the sequencer and adapted to provide a second clock signal, wherein the second clock signal is provided to the sequencer so that the sequencer can provide a series of test state signals to the ring oscillator and plurality of sub-circuits.

The transmitter circuit in the test circuit further comprises a coupler which is coupled to the ring oscillator and the antenna and is adapted to selectively couple the output of the ring oscillator to the antenna for transmission of the test result signal to the test unit. The coupler may capacitively couple the test result signal to the antenna. Alternatively, the coupler may modulate the impedance of the antenna to transmit the test result signal to the test unit.

There may be a plurality of test circuits that are placed on the wafer. The test unit may test each test circuit sequentially or test a plurality of the test circuits in parallel. Each test circuit may be formed adjacent to a die containing the integrated circuit. Alternatively, each test circuit may be formed on a die that contains the integrated circuit. Alternatively, each test circuit may be formed on a large percentage of dies on the wafer. Alternatively, each test circuit may be formed on dies near the edge of the wafer.

The invention also relates to a method of testing an integrated circuit on a wafer using a test circuit formed on the wafer with the integrated circuit, the test circuit comprising a ring oscillator circuit, a plurality of sub-circuits coupled to the ring oscillator circuit wherein each sub-circuit changes the frequency of oscillation of the ring oscillator circuit, and a control circuit to selectively couple the sub-circuits to the ring oscillator circuit, the method comprising:
  (a) activating the test circuit;
  (b) sequentially coupling the sub-circuits to the ring oscillator circuit to selectively change the frequency of oscillation of the ring oscillator circuit;
  (c) producing a test result signal in response to each sub-circuit selected by the control circuit; and,
  (d) analyzing the test result signal to determine the frequency of oscillation.

Each test conducted in the method is a parametric test. Accordingly, the method may further consist of calculating a value for the parameter being tested. Alternatively, the method may consist of calculating a ratio of values for the parameter being tested.

The method further comprises effecting step (b) according to the steps of:
  (e) providing a clock signal; and,
  (f) generating a sequence of test states and state signals based on the clock signal to switchably couple the sub-circuits to the variable ring oscillator.

Step (d) of the method further comprises the steps of:
  (g) coupling the test result signal to an antenna within the test circuit through a coupler in the test circuit; and,
  (h) enabling and disabling the coupler to intermittently transmit the test result signal to a test unit to allow the test unit to synchronize to the test result signal and analyze the test result signal.

The method further comprises using at least one sub-circuit that comprises a capacitive load to change the frequency of operation of the ring oscillator circuit.

The method also further comprises using at least one sub-circuit that comprises a capacitive load and a resistive load to change the frequency of operation of the ring oscillator circuit.

The method also further comprises using at least one sub-circuit that comprises a delay element to change the frequency of oscillation of the ring oscillator circuit.

The method further comprises using a sequencer for the control circuit.

The method further comprises sequentially testing a plurality of test circuits which are formed on the wafer. Alternatively, the method further comprises testing the plurality of test circuits on the wafer in parallel.

Further objects and advantages of the invention will appear from the following description, taken together with the accompanying drawings.

BRIEF DESCRIPTION OF THE DRAWINGS

For a better understanding of the present invention and to show more clearly how it may be carried into effect, reference will now be made, by way of example, to the accompanying drawings which show a preferred embodiment of the present invention and in which:

FIG. 17b is a spectrum of a simulation test result obtained from testing the schematic of FIG. 17a;

DETAILED DESCRIPTION OF THE INVENTION

Figure 1:
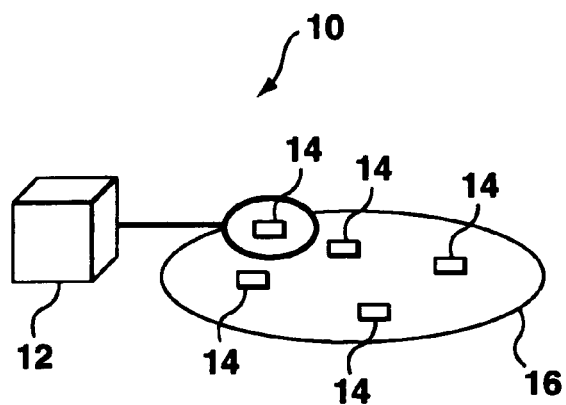
FIG. 1 is a block diagram of the wireless IC test system.

Reference is first made to FIG. 1 which shows a wireless IC test system 10 comprising a test unit 12 and a test circuit 14. The test circuit 14 is fabricated at a plurality of locations on a wafer 16 which contains a plurality of ICs. The test unit 12 is separate from the wafer 16 and is coupled wirelessly to any test circuit 14 on the wafer 16. The wireless IC test system 10 is designed to perform parameter testing of the wafer 16 as will be described in greater detail below. Alternatively, the wireless IC test system 10 may be extended to perform functional testing of the ICs on the wafer 16 as will be described in greater detail below.

Figure 2:
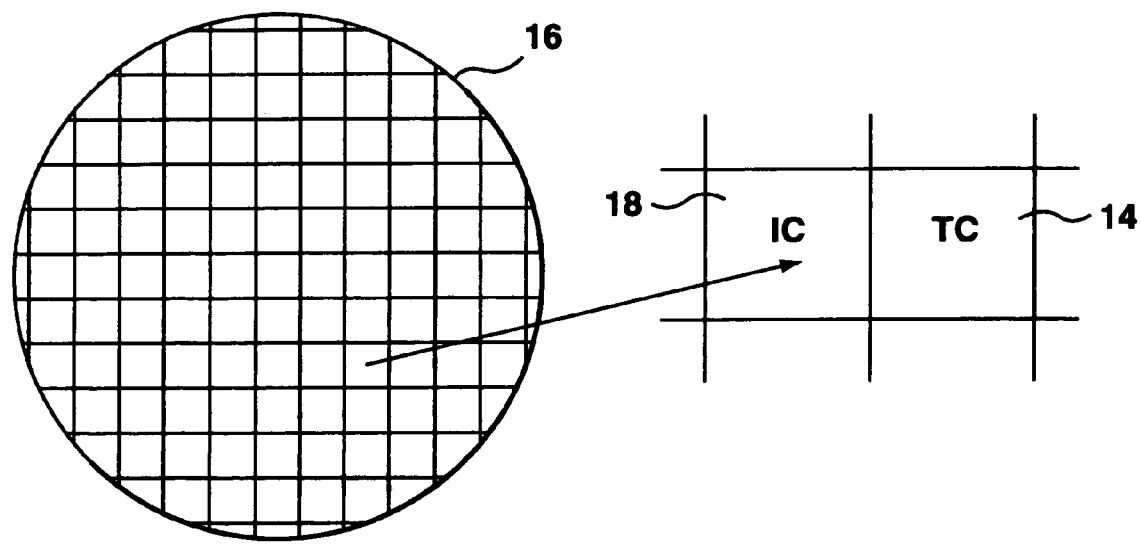
FIG. 2 is an embodiment of test circuit placement on the wafer to be tested.

Reference is next made to FIGS. 2 to 5 which show different embodiments for placing the test circuit 14 on the wafer 16. In FIGS. 2 to 5, each rectangle in the wafer 16 represents a die which may contain an IC 18. Referring to FIG. 2, the test circuit 14 may be placed in a die that is adjacent to the die which contains the IC 18 whose parameters are to be tested. This configuration would provide 100% coverage for testing the IC 18.

Figure 3:
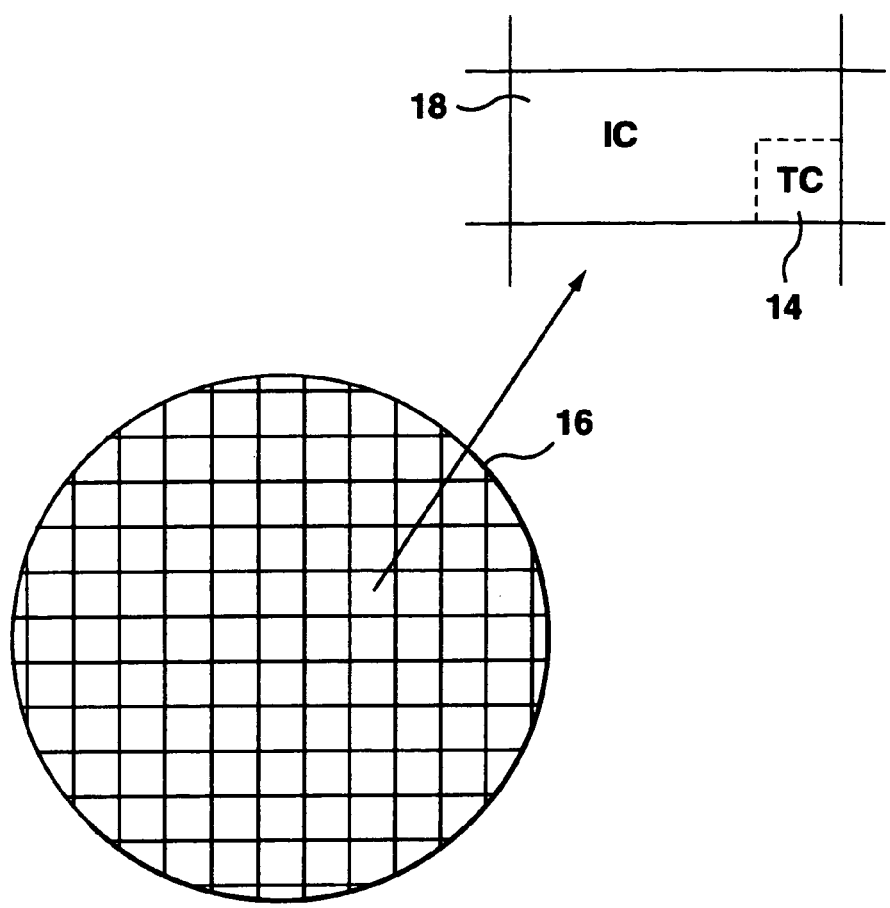
FIG. 3 is an alternative embodiment of test circuit placement on the wafer to be tested.

Referring to FIG. 3, the test circuit 14 could be fabricated within the same die in which the IC 18 is fabricated. This configuration would also provide 100% coverage for testing the IC 18. In this configuration, it is important that the test circuit 14 be very small in size so as to minimize the amount of chip real estate that it requires.

Figure 4:
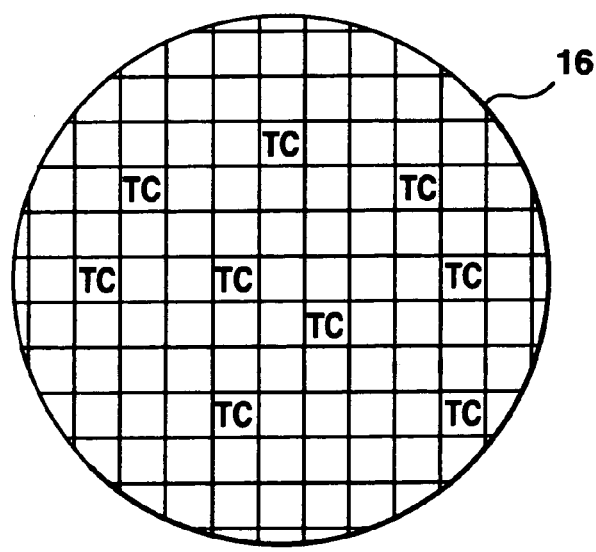
FIG. 4 is another alternative embodiment of test circuit placement on the wafer to be tested.

Another alternative placement strategy is shown in FIG. 4 in which the test circuit 14 is placed on locations upon the wafer 16, determined by a statistical means, to optimize the number of ICs 18 that are tested while providing less than 100% coverage. This may be beneficial in situations where it is not essential to have 100% test coverage or in situations where one needs to save on chip real estate.

Figure 5:
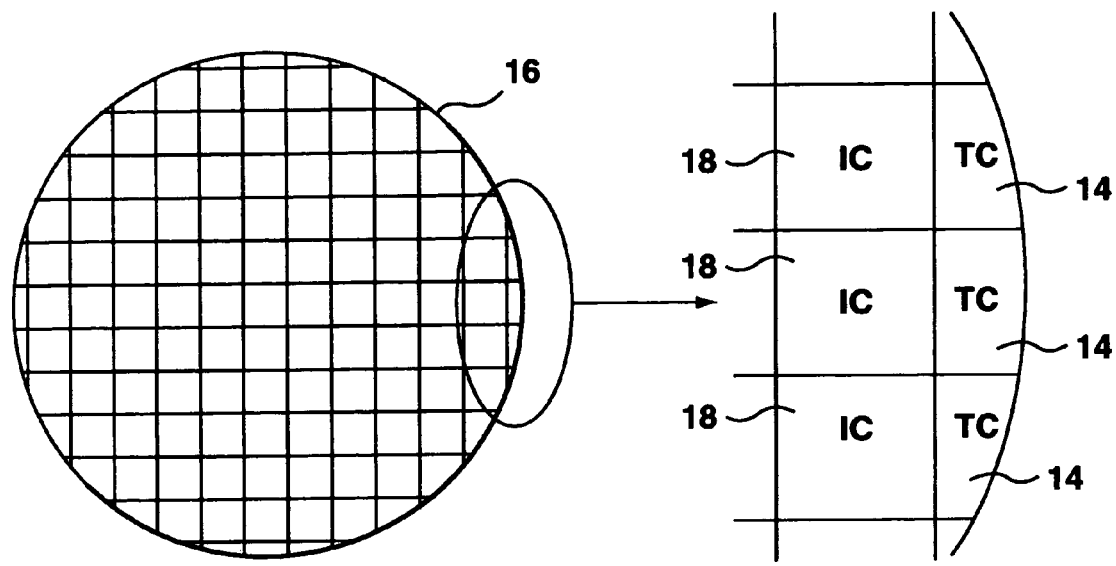
FIG. 5 is another alternative embodiment of test circuit placement on the wafer to be tested.

Another alternative placement strategy is shown in FIG. 5 in which the test circuit 14 is placed in dies which are located adjacent to the edges of the wafer 16 where a full IC 18 cannot be fabricated. This strategy will also result in less than 100% coverage for testing the IC 18.

Figure 6:
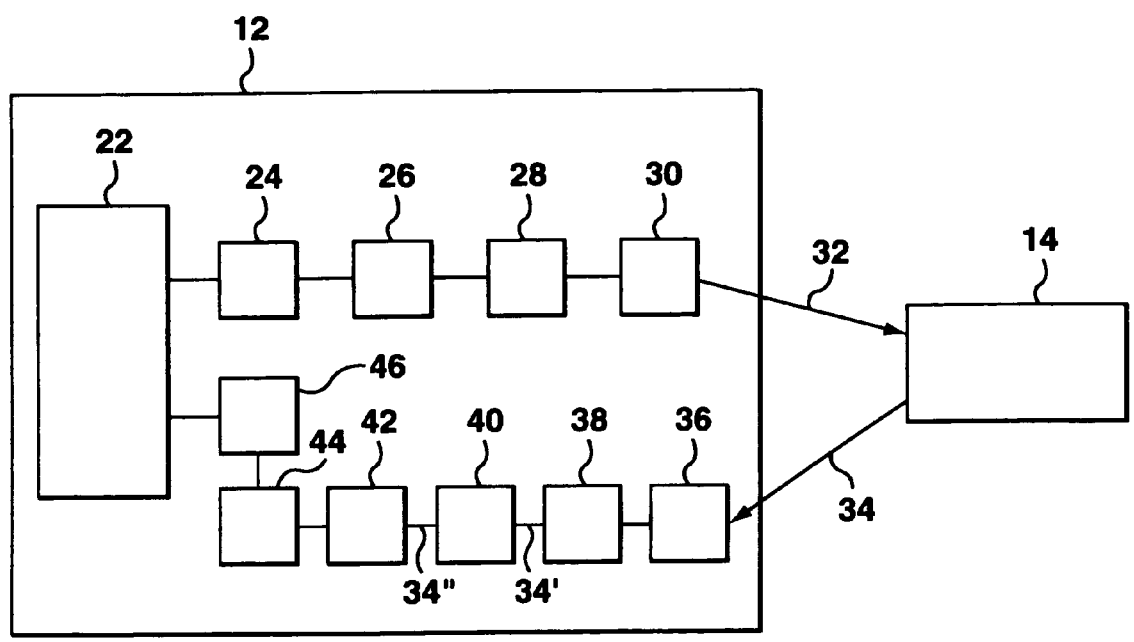
FIG. 6 is a block diagram of the test unit.

Referring next to FIG. 6, the test unit 12 may comprise a monitor 22, a logic means 24, an oscillator 26, an amplifier 28, a first antenna 30, a second antenna 36, a filter 38, an amplifier 40, a phase lock loop 42, a decoder 44 and a logic means 46. The monitor 22 may display the parameters of the RF power signal 32 that is transmitted to a particular test circuit 14 on the wafer 16. The RF power signal 32 is used to power the test circuit 14. The monitor 22 may also show the results of the test on the test circuit 14. The monitor 22 is connected to the logic means 24 which controls the oscillator 26. The oscillator 26 generates the RF power signal 32. The oscillator 26 is connected to the amplifier 28 which amplifies the RF power signal 32 to a level suitable to be received by the test circuit 14. The amplifier 28 then provides the amplified RF power signal 32 to the antenna 30 which radiates the RF power signal 32 towards the test circuit 14. Only the RF power signal 32 is sent to the test circuit 14. The test unit 12 does not send any test signals to the test circuit 14.

The test circuit 14 then generates a test result signal 34 which is transmitted to the test unit 12. The test result signal 34 is received by the second antenna 36. The test result signal 34 is then sent to the filter 38 which filters any noise that is present in the test result signal 34. The filtered test result signal 34' is then amplified by the amplifier 40. The amplified, filtered test result signal 34" is then sent to the phase lock loop 42 which is used to lock onto to the frequency of the amplified, filtered test result signal 34". The phase lock loop 42 may preferably be a wide capture phase lock loop which locks-in to a wide range of input frequencies. The decoder 44 is then used to determine which test was performed by the test circuit 14 based on the amplified, filtered test result signal 34" and the logic means 46 is used to calculate the value of the parameter that was tested. The logic means 46 then sends the test results and the calculated parameter value to the monitor 22 which displays the test results and parameter value. Alternatively, instead of a calculated parameter value, the test amplified filtered test result signal 34" may include functional test result data.

The test unit 12 can be designed with a lot of flexibility since the test unit 12 is not contained on the wafer 16. Accordingly, the test unit 12 can have a very complicated design. The test unit 12 may also have several different embodiments. For instance, the test unit 12 may use a lock-in amplifier with a spectrum analyzer to view the frequency of the test result signal 34 which contains the parameter information. Alternatively, analysis of the test result signal 34 may involve performing an FFT on a portion of the test result signal 34. Furthermore, the functionality of the first logic means 24 and the functionality of the second logic means 46 may be implemented by the same logic means. In addition, another alternative may be to use only one antenna in place of the first antenna 30 and the second antenna 36.

With this configuration, the test circuit 14 can operate over a wide range of frequencies, such as hundreds of MHz to several GHz. The particular technology which is used to implement the test circuit 14 will also affect the frequency range of operation. Higher frequency allow for a smaller receiving antenna on the test circuit 12 as well as more directionality. The test result signal 34, based on the configuration of the test circuit 14, could radiate at a frequency on the order of several hundred MHz to several GHz. However, the power consumed by the test circuit 14 must be minimized since there is no other power source for providing power to the test circuit 14 other than the RF power signal 32. Furthermore, the intensity of the RF power signal 32 is low so that there will not be any interference with other circuitry on the IC 18.

To couple the test unit 12 to a desired test circuit 14 on the wafer 16, a number of techniques could be used. One particular embodiment would be to localize the RF power signal 32 to the area of the wafer 16 where the test circuit 14, for which testing is desired, is located. This can be done with a small loop antenna or by using some ferrite material to maximize the electromagnetic flux to an area local to the test circuit 14. Likewise, the test result signal 34 would also be localized to the second antenna 36 of the test unit 12 since the test circuit 14 is in close proximity to the test unit 12.

An alternative embodiment for coupling the RF power signal 32 to the test circuit 14 may be to implement a circuit discrimination method in which each test circuit 14 would have a unique sequence number. The sequence number would be used when transmitting the RF power signal 32 so that a test circuit 14 could determine if the RF power signal was addressed to it. Likewise, the test circuit 14 could use this sequence number when transmitting the test result signal 34 to the test unit 12 and the test unit 12 could have a decoder means to detect the sequence number and identify which test circuit 14 sent the test result signal 34.

Another further arrangement would be to use the geometric property that the test circuit 14 directly underneath the first antenna 30 of the test unit 12 would receive the most energy and therefore have the highest available power. Likewise, the test circuit 14, directly underneath the test unit 12, would radiate the highest energy signal so that the test unit 12 need only lock onto the highest energy signal.

The test unit 12 of the wireless IC test system 10 may be adapted to test sequentially; i.e. only one test circuit 14 on the wafer is tested at a time. Alternatively, the test unit 12 may potentially energize several test circuits 14 simultaneously. In this case, the test unit 12 may comprise several transmitters (i.e. items 24 to 30) and receivers (i.e. items 36 to 46) to provide for the testing of several test circuits 14 in parallel. The antennas of the transmitters could be localized over the test circuits 14 which are to be tested. Accordingly, the antennas of the transmitters would have to be separated by a certain distance to avoid interference. Likewise, the receivers in the test unit 12 must be separated as well so that they receive and evaluate the test results.

Figure 7:
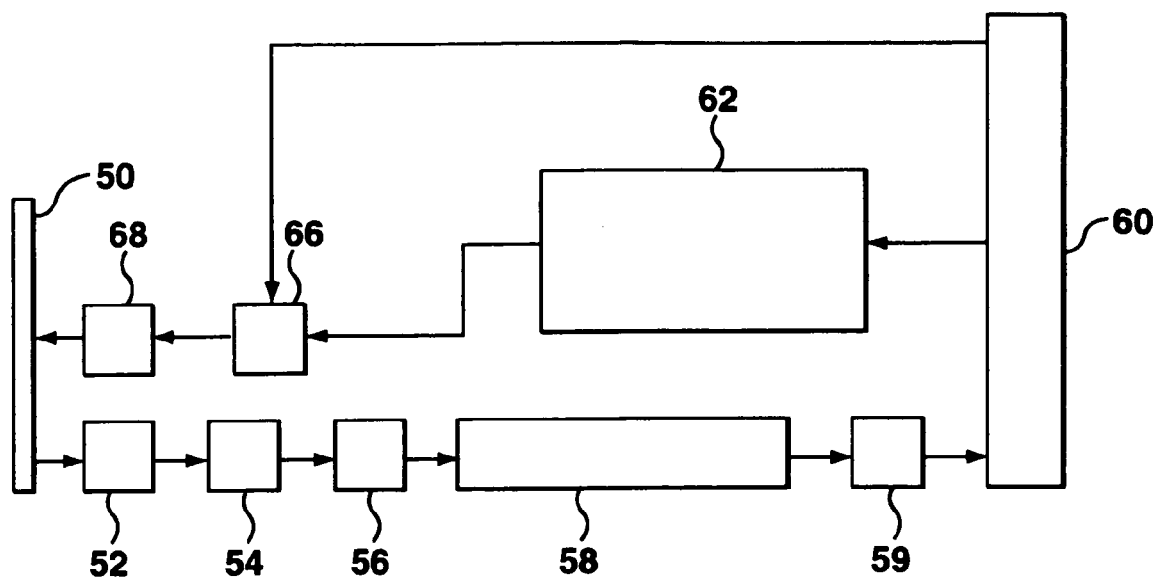
FIG. 7 is a block diagram of an embodiment of the test circuit.

Reference is now made to FIG. 7 which shows the layout of the test circuit 14 in block format. The test circuit 14 includes the following components connected together: an antenna 50, a voltage rectifier 52, a voltage regulator 54, an energy storage element 56, a ring oscillator 58, a divider 59, a sequencer 60, a variable ring oscillator 62, a synchronization element 66 and a coupler 68. Each of these elements will now be described.

The antenna 50 receives the RF power signal 32 and transmits the test result signal 34 back to the test unit 12. The antenna 50 must maximize the amount of incident energy it receives and minimize the amount of energy needed to send the test result signal 34 from the test circuit 14 to the test unit 12.

Figure 8:
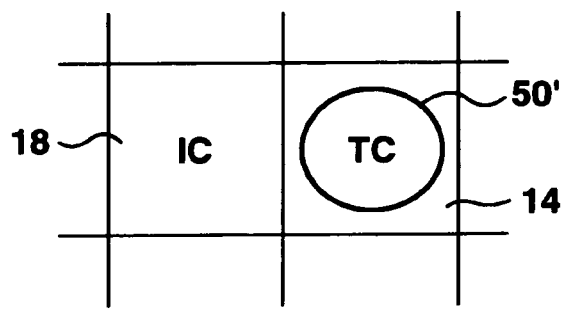
FIG. 8 is an embodiment of the antenna.

Referring to FIG. 8, the antenna 50 may be a loop antenna 50' which is looped around the test circuit 14. The loop antenna 50' may be made from the metallization layers which are deposited on the wafer 16 during the fabrication of the IC 18. The antenna 50 should be optimized for power reception. Part of this optimization involves having a close coupling between the antenna 50 on the test circuit 14 and the first antenna 30 on the test unit 12. Furthermore, since the frequency of the RF power signal 32 is so high, the loop antenna can have a length which is much shorter than the wavelength of the RF power signal 34. In an alternative embodiment, one antenna may be used for the entire wafer 16. In a further alternative embodiment, the antenna 50 may be placed along the cut lines of the dies, if the IC 18 is not to include the test circuit 14 after dicing.

Figure 9A:
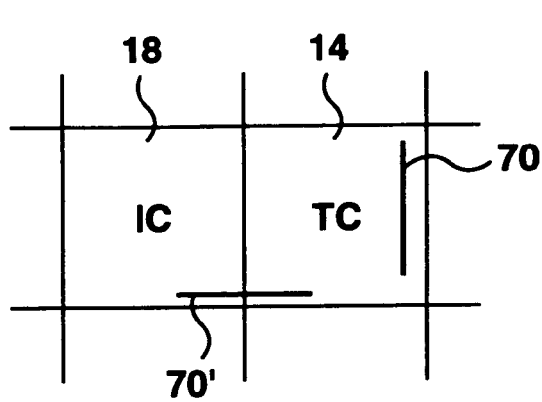
FIG. 9a is an alternative embodiment of the antenna as a monopole antenna.
Figure 9B:
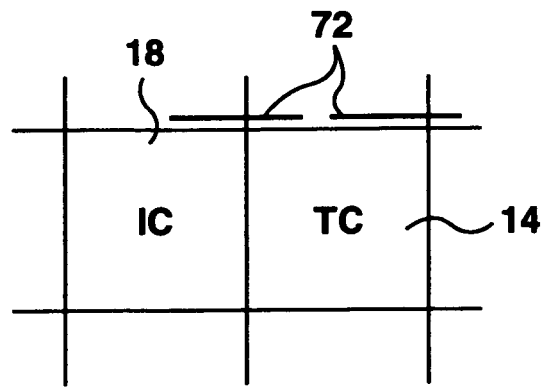
FIG. 9b is another alternative embodiment of the antenna as a dipole antenna.

An alternative embodiment of the antenna 50 is illustrated in FIG. 9a which shows a monopole antenna 70 placed in the die which contains the test circuit 14. Alternatively the monopole antenna 70 could be laid across the dies which contain the test circuit 14 and the IC 18 shown by antenna 70'. Alternatively, a dipole antenna 72 could be used as shown in FIG. 9b. In this Figure, the dipole antenna 72 spans multiple die areas adjacent to the dies which contain the IC 18 and the test circuit 14. Alternatively, the dipole antenna 72 could be situated such that it only occupies two dies.

Figure 9C:
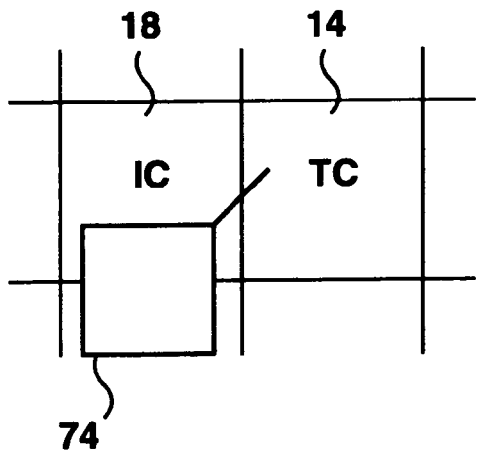
FIG. 9c is another alternative embodiment of the antenna as a patch antenna.

Another alternative embodiment of the antenna 50 is a patch antenna 74 as shown in FIG. 9c. The patch antenna 74 occupies multiple dies and is oriented towards the test circuit 14. In this configuration, the patch antenna 74 can have a dimension in the centimeter range which would allow the antenna 50 to receive an RF power signal 32 with a frequency in the Gigahertz range.

Figure 9D:
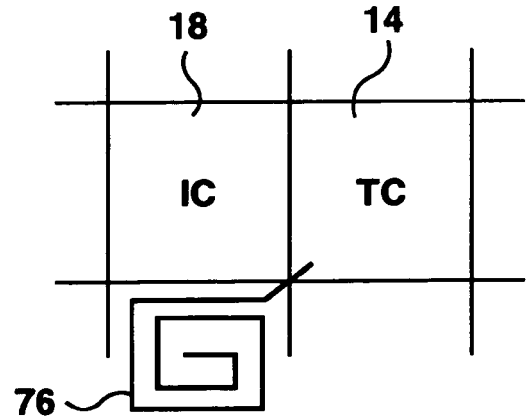
FIG. 9d is another alternative embodiment of the antenna as a spiral antenna.

Referring to FIG. 9d, another alternative embodiment of the antenna 50 is a spiral antenna 76. The spiral antenna 76 is in a die which is adjacent to the die that contains the test circuit 14. Alternatively, since the test circuit 14 is small in area, the spiral antenna 76 may be in the same die that contains the test circuit 14.

The operation of the antenna 50 is shown with reference to FIG. 7. The antenna 50 receives the RF power signal 32 transmitted from the test unit 12. The antenna 50 transmits the received signal to the voltage rectifier 52. The voltage rectifier 52, voltage regulator 54 and the energy storage element 56 together are adapted to provide DC power to the remainder of the test circuit 14. The voltage rectifier 52 provides as large a DC voltage as possible given the low level energy of the RF power signal 32.

Figure 10:
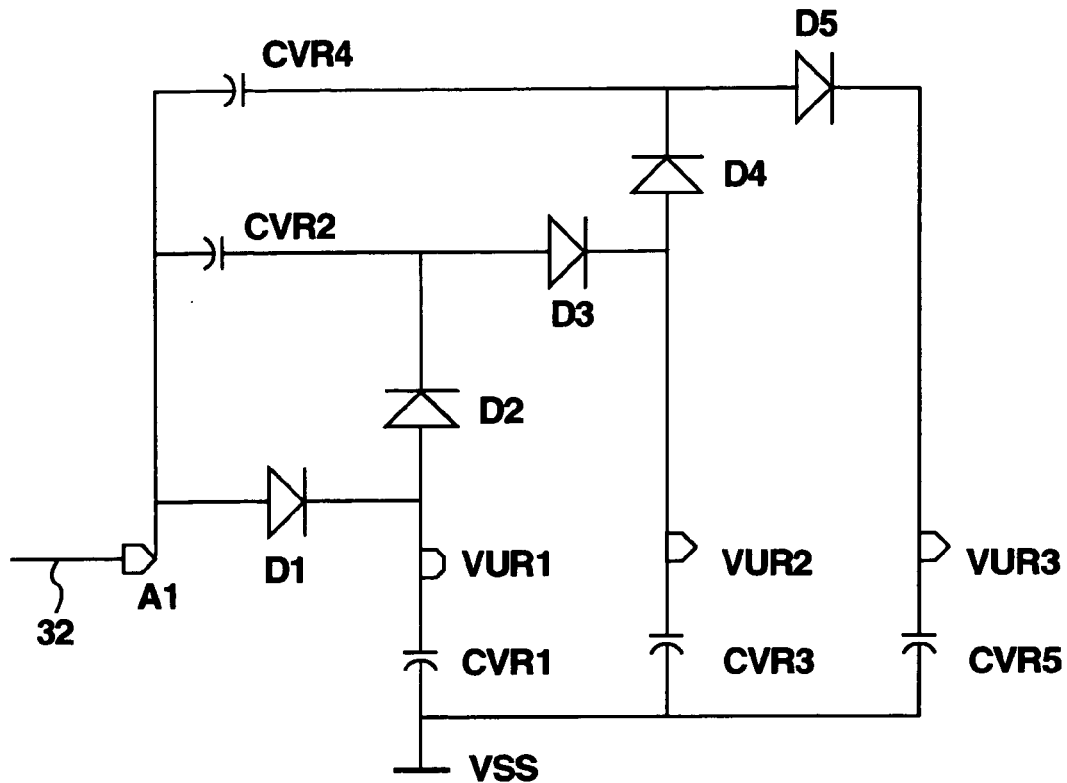
FIG. 10 is a schematic of the voltage rectifier.

Referring to FIG. 10, the voltage rectifier 52 consists of a network of diodes D1, D2, 03, D4 and D5 and capacitors CVR1, CVR2, CVR3, CVR4 and CVR5. The antenna 50 is connected at node A1. The diode D1, which is connected to node A1, and the capacitor CVR1 rectify the incoming RF power signal 32 to provide a DC voltage VUR1 which is an unregulated voltage. The voltage VUR1, in combination with the capacitors CVR2 and CVR3 and the diodes D2 and D3 creates a doubled voltage VUR2. This process is repeated using the voltage VUR3, the diodes D4 and D5 and the capacitors CVR4 and CVR5 to produce a tripled voltage VUR3. The voltages VUR1, VUR2 and VUR3 are used for power by the other parts of the test circuit 14. In the present design the diodes are constructed out of N-well FETs that are connected as diodes as is commonly known to those skilled in the art. Alternatively, Schottky diodes may be used.

Figure 11:
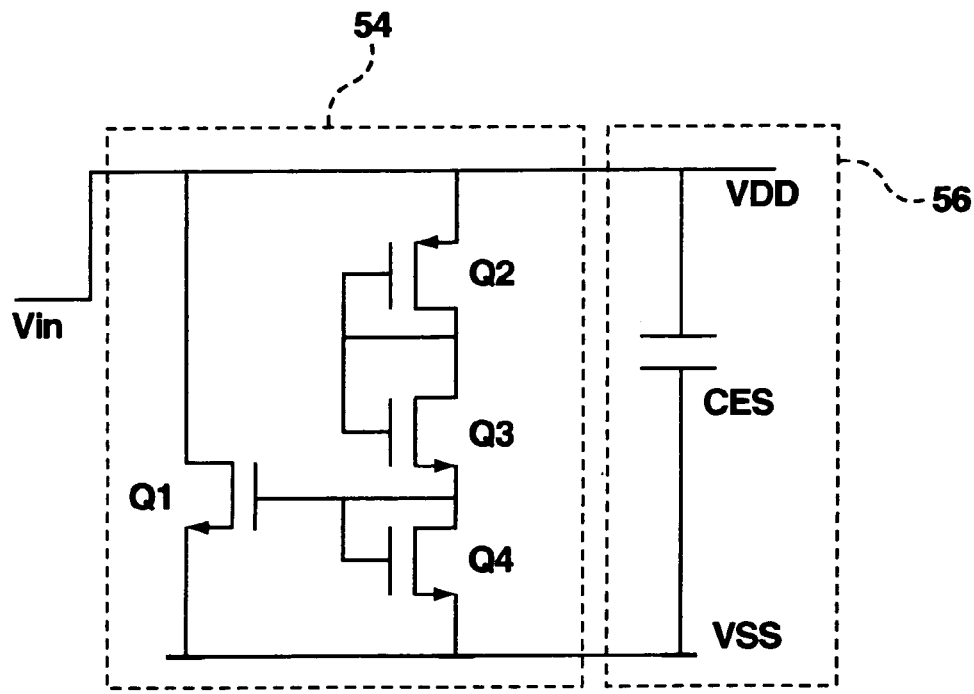
FIG. 11 is a schematic of the voltage regulator and the storage element.

Referring next to FIG. 11, the voltage regulator 54 comprises a network of transistors Q1, Q2, Q3 and Q4. The voltage regulator 54 regulates the supply voltage VDD which is used as power by the remainder of the test circuit 14. The input voltage Vin to the voltage regulator 54 is one of the outputs of the voltage rectifier 52 (i.e. VUR1, VUR2 or VUR3). The transistors Q2, Q3 and Q4 act as a voltage sense circuit. When the input voltage Vin goes above the voltage threshold of the Q2, Q3, Q4 transistor combination, the transistor Q1 is turned on which causes the input voltage Vin to be shunted to ground VSS. This causes the input voltage Vin to be reduced which causes the supply voltage VDD to be regulated to be less than the threshold voltage of the Q2, Q3, Q4 transistor combination. The voltage regulator 54 also protects the substrate of the IC 18 from high voltages which is important since an IC designed with sub-micron technology has a very low breakdown voltage.

Still referring to FIG. 11, the energy storage element 56 is preferably a capacitor CES. The capacitor CES may store energy that may be provided to the rest of the test circuit 14. However, not much energy must be stored if there is sufficient energy provided by the RF power signal 32. The capacitor CES also acts to smooth the supply voltage VDD.

Figure 12:
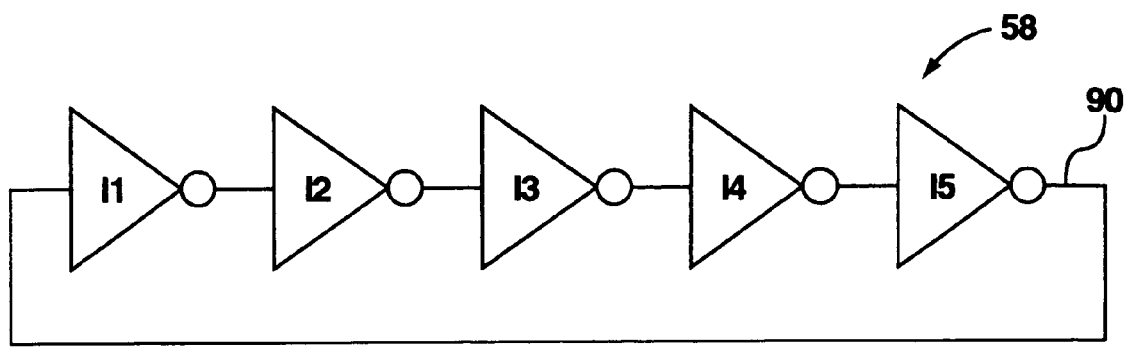
FIG. 12 is a schematic of the ring oscillator.

Reference is now made to FIG. 12 which shows that the ring oscillator 58 consists of five inverters I1, I2, I3, I4 and I5, which are connected in a series loop feedback configuration. The ring oscillator 58 is adapted to provide a clock signal 90 that is used to synchronize the test circuit 14. The clock signal 90 may be at a frequency which is comparable to the frequency at which the IC 18 was designed to operate which may, for example, be in the range of several hundred MHz to several GHz. During each half period of the clock signal 90, the signal will propagate around the loop with an inversion. If each inverter (I1, I2, I3, I4 and I5) have similar loads at their output nodes then each inverter has a similar delay ($\tau_{inv}$)so that a half period of the clock signal 90 is $n*\tau_{inv}$ seconds long. The clock signal 90 therefore has a frequency of $1/(2*n*\tau_{inv})$ Hz.

Ring oscillators are standard in IC design, however, it is typical to use a ring oscillator which consists of a large odd number of inverters such as 101 inverters. A large number of inverters is required because in probe testing, sub-nanosecond test signals cannot be propagated. However, since RF signals are used in the wireless IC test system 10 of the present invention, the clock signal 90 may have a higher frequency that can be used in the test circuit 14. Accordingly, the ring oscillator 58 may consist of a substantially lower number of inverters. Furthermore, a crucial design constraint for the ring oscillator 58, as well as the other circuitry in the test circuit 14, is that the ring oscillator 58 operates over a wide range of supply voltage levels and IC technologies.

Figure 13:
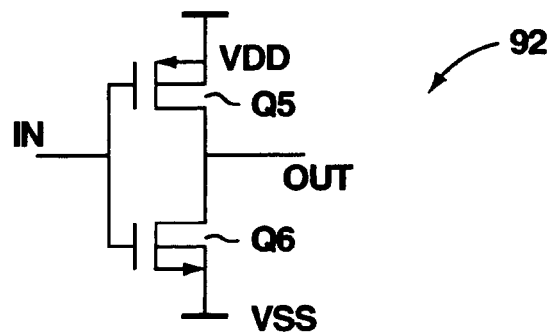
FIG. 13 is a schematic of the inverter used in the ring oscillator of FIG. 12.

Reference is next made to FIG. 13 which shows a schematic of the inverter used in the ring oscillator 58. The inverter is a standard CMOS inverter 92 consisting of two transistors Q5 and Q6. The inverter 92 was designed using minimal feature sizes which resulted in the inverter 92 requiring minimal chip area and dissipating minimal power while operating at frequencies consistent with those mentioned for the clock signal 90.

Figure 14:
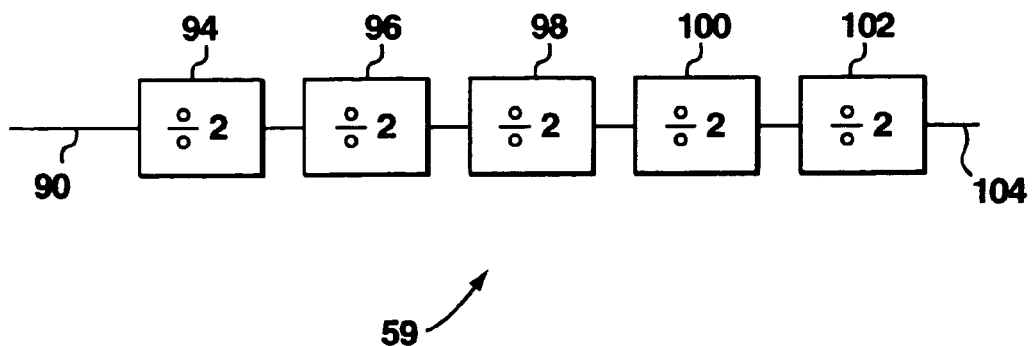
FIG. 14 is a schematic of the divider.

Referring to FIG. 14, an embodiment of the divider 59 consists of five divide by two circuits 94, 96, 98, 100 and 102 that are connected in series. The input to the divider 59 is the clock signal 90. Since five divide by two circuits are used, the divider output is a reduced clock signal 104 which has a frequency that is 1/32 of the frequency of the clock signal 90. In the divider 59, each divide by two circuit was a D flip-flop modified to behave as a T flip-flop clocked by a single input line as is commonly known in the art. Each divide by two circuit was also designed to have minimal feature sizes and a minimal number of transistors so that the divider 59 could work faster, dissipate less power and occupy a smaller amount of chip area. The requirement of a minimal number of transistors was achieved by using dynamic logic flip-flops. The dynamic logic version of the T flip-flop resulted in a further reduction in power consumption while operating at full speed with a 1 V supply voltage. This occurred because of the reduced capacitive loading in the dynamic logic circuit which was operated continuously. The reduced clock signal 104 is then fed to the sequencer 60.

Figure 15:
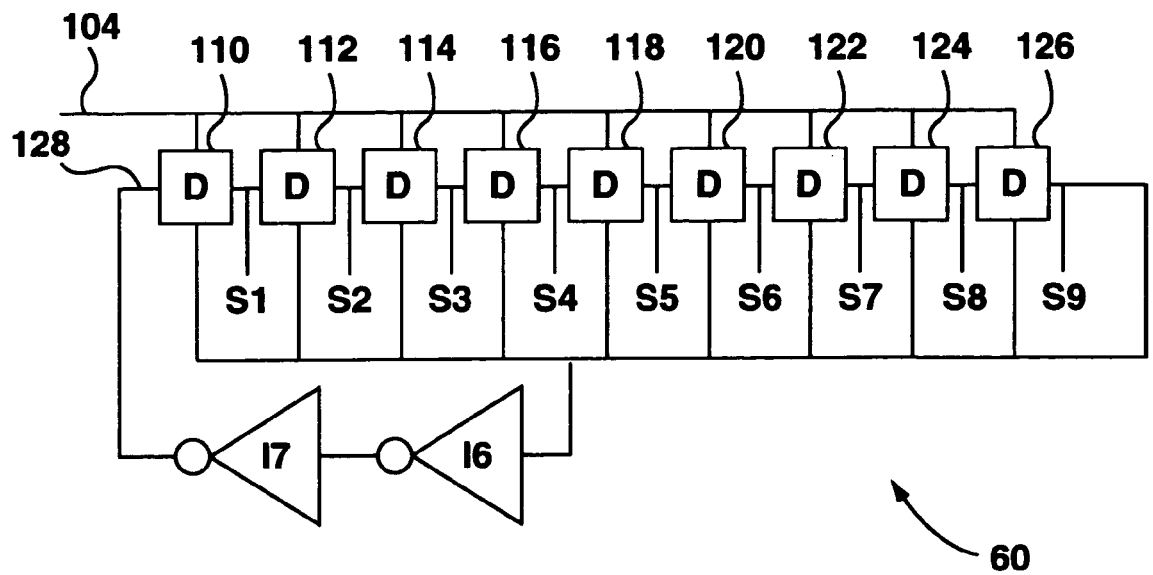
FIG. 15 is a schematic of the sequencer.

Referring now to FIG. 15, the sequencer 60 comprises nine D flip-flops 110, 112, 114, 116, 118, 120, 122, 124 and 126 connected in series in a shift register format and two inverters 16 and 17. The number of D flip-flops correlates with the number of test states which will be described in greater detail below. As such, the number of D flip-flops may vary depending on the number of test states that are used in the test circuit 14. The sequencer 60 was also designed using dynamic logic D flip-flops for the reasons previously stated for the divider 59.

The sequencer 60 shifts one bit through the chain of D flip-flops upon each transition of the reduced clock signal 104 from a digital logic value of '0' to a digital logic value of '1' (a negative edge triggered flip-flop may also be used). The output S9 of the final D flip-flop 126 is recycled to the input 128 of the first D flip-flop 110. The sequencer 60 provides test enable signals (i.e. state signals S2, S3, S4, S5, S6, S7, S8 and S9). The sequencer 60 ensures that only one state signal has a digital logic value of '1' for a given period of the clock signal 90. Once the state signal S9 has a digital logic value of '1', the state signal S9 is used to reset each of the D flip-flops in the sequencer 60. The state signal S9 also creates a digital logic value of '1' at the input 128 of the first flip-flop 110 to restart the sequence of test enable signals. This particular implementation was chosen for its minimal transistor count and the ability to operate with very low supply voltages. However, dynamic power consumption is not as critical for the sequencer 60 since the sequencer 60 is operated at 1/32 of the clock signal 90. Additional circuitry for master reset and startup functionality (i.e. inverters 16 and 17) are included so that a new test can be started as fast as possible after power up of the test circuit 14. The two inverters 16 and 17 ensure that there is a good square edge or hard transition for the input signal 128 to the first D flip-flop 110.

Figure 16:
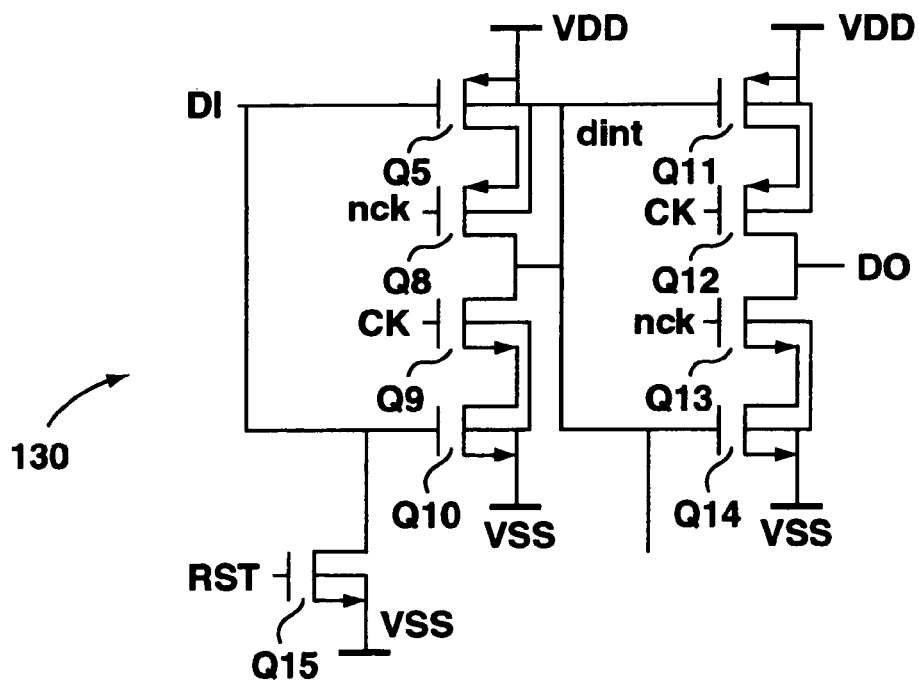
FIG. 16 is a schematic of the D flip-flop used in the sequencer of FIG. 15 and the divider in FIG. 14.

Reference is next made to FIG. 16 which shows a schematic of the D flip-flop 130 which was used in the sequencer 60. The D flip-flop 130 includes reset RST, clock CK, input D1 and output D2 signals. The nck signal is the inverse of the clock CK signal and the signal dint is an internal data signal that is stored in between transitions of the clock signal CK. Data is transferred from the input D1 of the D flip-flop 130 to the output DO of the flip-flop 130 on a complete period of the clock signal CK. The D flip-flop 130 was designed to give minimum power dissipation by the use of complementary clock signals for the input and output portions of this logic circuit.

Before discussing the variable ring oscillator 62, the basic test methodology of the test circuit 14 will be discussed. The test methodology is based on indirectly measuring parameters or ratios of parameters of the IC 18 by using sub-circuits of the test circuit 14. However, sub-circuits of the IC 18 may also be used as described further below. There are a large number of possible parameters and likewise ratios of parameters that could be tested with the present invention. In the embodiment of the wireless IC test system 10, the parameters that were tested were capacitance, resistance and gate delay. These parameters are important at various stages of the IC manufacturing cycle as well as for fundamental device operation. To test capacitance, sub-circuits that include capacitors will be used in the variable ring oscillator 62. Likewise to test resistance and gate delay, sub-circuits that include resistors and inverters, respectively, will be used in the variable ring oscillator 62. Note that these resistors, inverters and capacitors may be part of the test circuit 14 or may be resistors, inverters and capacitors which are part of the IC 18. In this fashion, the IC 18 may be tested indirectly or directly. Furthermore, various other structures could be substituted for resistance, capacitance and gate delay. For capacitance, dielectric thickness or ion implantation could be measured. For resistance, the resistance of the poly-silicon layer, or the resistivity of the substrate may be measured and for gate delay, the threshold voltage of transistors in the IC 18 may be measured. In terms of ratios of parameters, these ratios would depend on the circuit layout of the parameters being tested as described in more detail below.

To accomplish parameter testing, one embodiment switches the sub-circuits into and out of the variable ring oscillator 62 based on the test state signals S1, S2, S3, S4, S5, S6, S7, S8 and S9 which are supplied by the sequencer 60. Most of the sub-circuits that are switched into the variable ring oscillator 62 load the variable ring oscillator such that the sub-circuit will affect the frequency of oscillation of the variable ring oscillator 62. Differences in the frequency of oscillation of the variable ring oscillator 62 will then allow for parameter measurement as will be shown below.

Figure 17A:
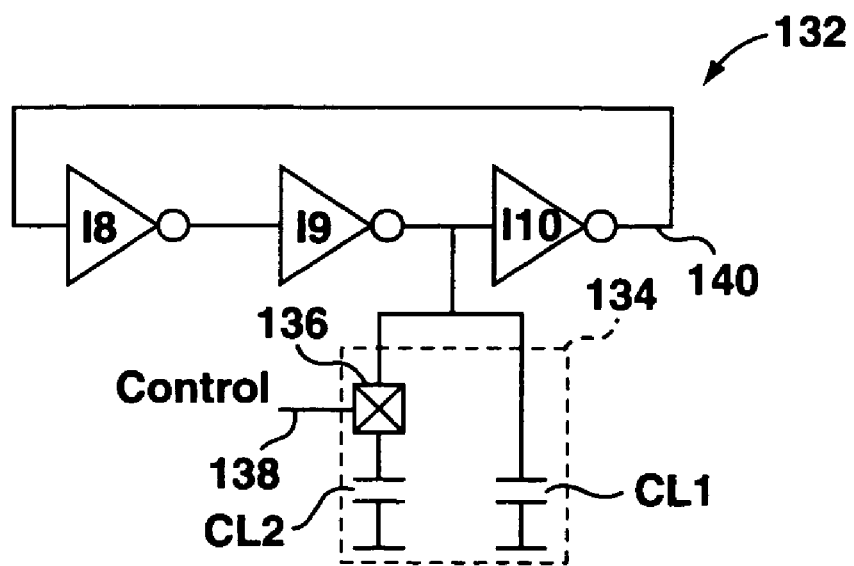
FIG. 17a is a simplified schematic of a ring oscillator illustrating parameter testing.

To illustrate the concept of using the frequency of oscillation of a ring oscillator to measure IC parameters, reference will now be made to FIG. 17a which shows a ring oscillator 132 comprising 3 inverters I8, I9 and I10 and a variable load 134 which includes capacitors CL1 and CL2 and a transmission gate 136. The capacitor CL2 is switched into the ring oscillator 132 when the transmission gate 136 is enabled by a control signal 138. When the transmission gate 136 is disabled, the load 134 on the ring oscillator 132 is dominated by the capacitor CL1. As previously discussed, if the ring oscillator 132 did not have the load 134, and the load of each inverter in the ring oscillator 132 were similar, the ring oscillator 132 would oscillate at a frequency of $1/(2*3*\tau_{inv})$. However, if the load 134 on the second inverter I9 in the ring oscillator 132 was made large compared to the load of the inverters I8 and I10, then the delay of the ring oscillator 132 would be dominated by the delay associated with the inverter I9. Accordingly, the frequency of oscillation for the ring oscillator 132 would be proportional to the load 134 of the second inverter I9 (the load of the inverters I8 and I10, although not shown, includes the internal parasitic capacitances of the transistors used in the inverters and interconnect capacitances, i.e. a parasitic capacitive load, and a lumped resistance). In this case, the ring oscillator 132 would have a frequency of oscillation given by the following equation:

$$f_{osc}=1/\tau \tag{1}$$

where $\tau$ is a time constant associated with the load 134 of the second inverter I9. When the transmission gate 136 is disabled, the load 134 is the product of the capacitor CL1, a lumped resistance $R_{lump}$ and a constant k. The value $R_{lump}$ is the equivalent resistance seen at the output of the inverter I9 and the constant k depends on the substrate of the IC 18 (i.e. silicon versus gallium arsenide) and the IC technology (i.e. gate size). The time constant is therefore $k*R_{lump}*CL1$. When the transmission gate 136 is enabled, the time constant becomes $k*R_{lump}*(CL1+CL2)$ since the capacitors CL1 and CL2 are now in parallel. Therefore, the two frequencies of oscillation of the ring oscillator 132 are given by the formulas:

$$f_{osc1}=1/(k*(R_{lump}*CL1)) \tag{2}$$

$$f_{osc2}=1/(k*(R_{lump}*(CL1+CL2))) \tag{3}$$

When the frequencies of oscillation are measured, these formulas could be used to calculate the capacitances of the capacitors CL1 and CL2. Alternatively, based on the original design values for the capacitances CL1 and CL2 of the capacitors CL1 and CL2, an expected ratio of (CL1+CL2)/CL1 can be compared to the measured ratio of $f_{osc1}/f_{osc2}$ to determine if there were any flaws in the fabrication process (this ratio comparison is based on dividing equation 2 by equation 3).

Figure 17B:
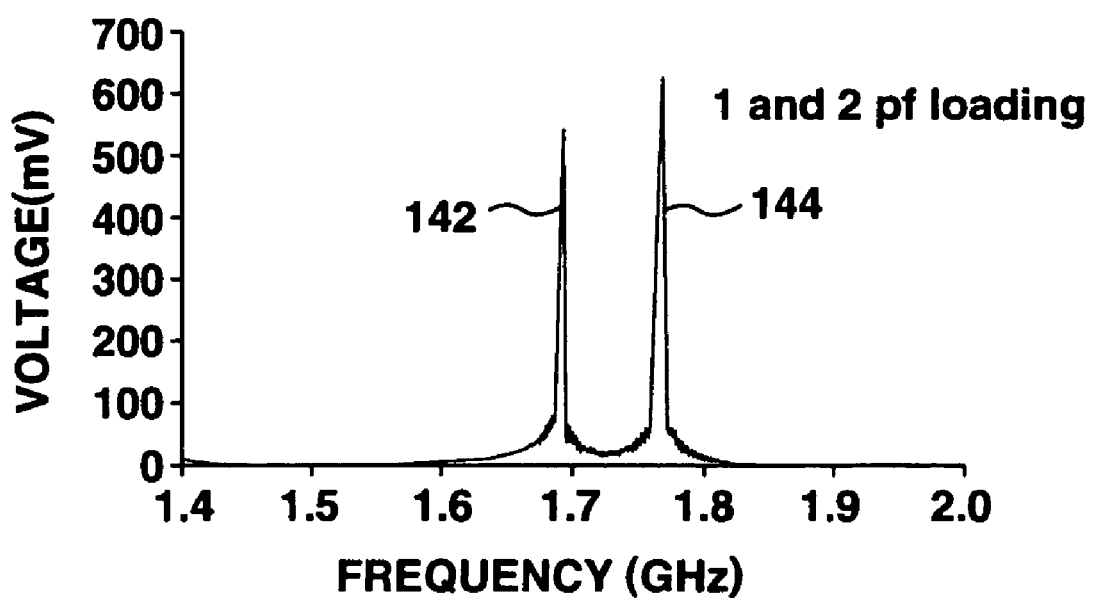

The ring oscillator 132 was simulated to determine whether the two capacitors CL1 and CL2 would result in two oscillation frequencies that could be resolved when measured. Referring to FIG. 17b, the amplitude spectrums of the output 140 of the ring oscillator 132, when the load 134 first consisted of the capacitor CL1 and then the parallel combination of CL1 and CL2, were combined. FIG. 17b shows that the two oscillation frequencies (peaks 142 and 144) are distinct enough to be measured during a parametric test. Based on the measured oscillation frequencies ($f_{osc1}$ and $f_{osc2}$) and the design values of the capacitors CL1 and CL2, an indication of the status of the fabrication process based on original design values can be checked during parametric testing by comparing the ratios mentioned previously.

Figure 18:
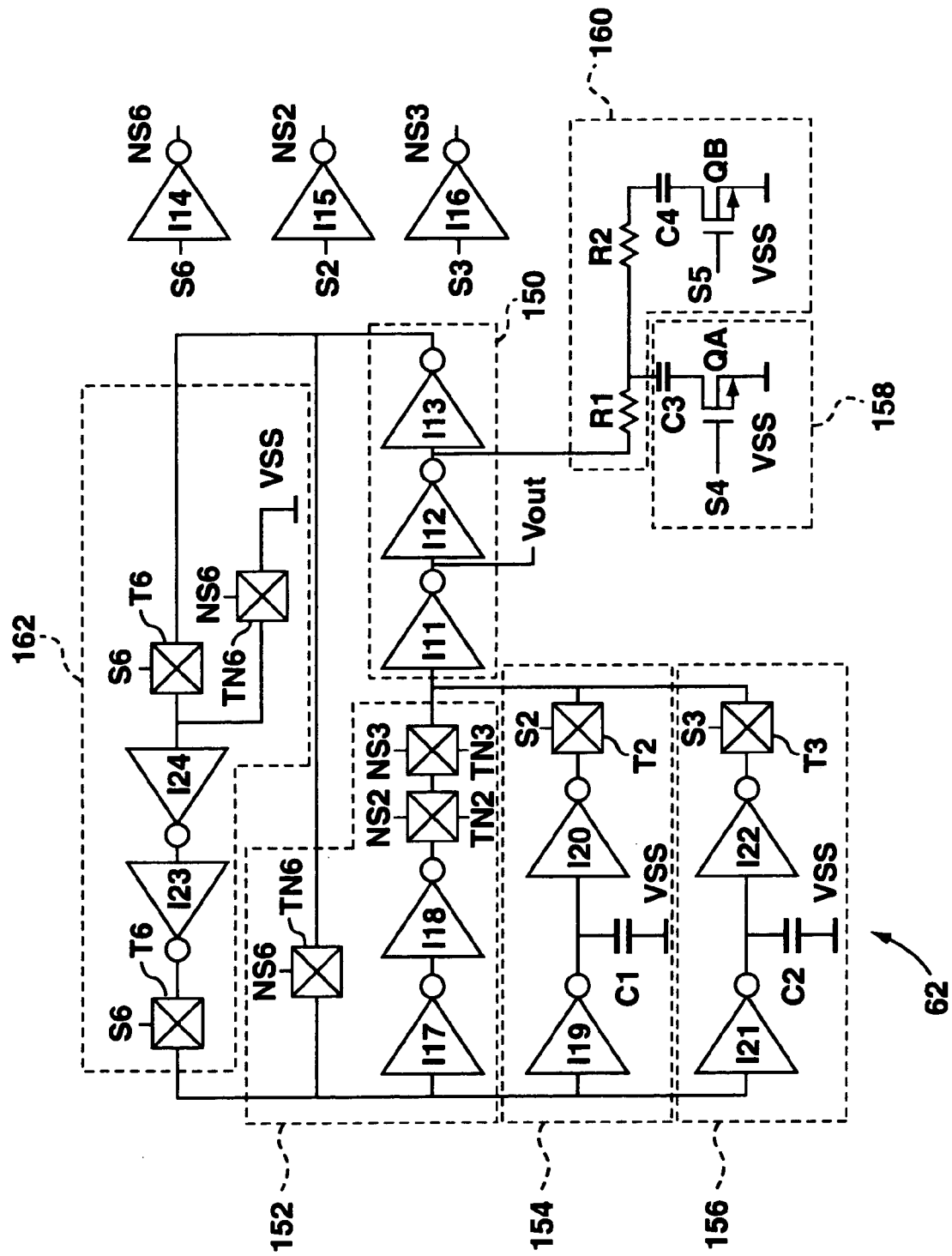
FIG. 18 is a schematic of the variable ring oscillator.

Reference is now made to the variable ring oscillator 62 shown in FIG. 18. The variable ring oscillator 62 was designed to occupy a minimal amount of die area, operate at high speed and dissipate a minimal amount of power. The variable ring oscillator 62 comprises a base ring oscillator 150, sub-circuits 152, 154, 156, 158, 160, 162, inverters I11, I12, I13, I14, I15, I16, I17, I18, I19, I20, I21 and I22, transmission gates T2, T3, T6, TN2, TN3 and TN6 and a number of resistors, capacitors and transistors which will be discussed in greater detail. The base ring oscillator 150 comprises three inverters I11, I12 and I13 that oscillate at a base frequency. The sub-circuits 152, 154, 156, 158, 160, and 162 are used to vary the base frequency of oscillation for the base ring oscillator 150 such that resistance, capacitance and gate delay parameter values of the IC 18 can be indirectly measured based on the principle illustrated in FIG. 17. The output of the variable ring oscillator 62 is at the circuit node Vout.

To enable these sub-circuits, test state signals S2, S3, S4, S5 and S6 are used to enable or disable the transmission gates T2 and T3, the transistors QA and QB and the transmission gate T6 respectively. There are also state signals NS2, NS3 and NS6 that are used to enable the transmission gates TN2, TN3 and TN6. The test state signals S2, S3, S4, S5 and S6 are obtained from the sequencer 60. The test state signals NS2, NS3 and NS6 are obtained by inverting the test state signals S2, S3 and S6 by using the inverters 114, 115 and 116. In FIG. 18, the inverters 114, 115 and 116 appear disjoint from the variable ring oscillator 62, however this is done for simplicity. In the implementation of the variable ring oscillator 62, the inverters 114, 115 and 116 receive the test state signals S2, S3 and S6 from the sequencer 60 and the outputs of the inverters 114, 115 and 116 are connected to the sub-circuits 152 and 162 at the circuit nodes where the test state signals NS2, NS3 and NS6 are applied.

The transmission gates T2, T3, T6, TN2, TN3 and TN6 act as switching elements which allow the sub-circuits 152, 154, 156, 158, 160, and 162 to be attached to the base ring oscillator 150 when their control signal, which is the respective test state signal to which they are connected, has a digital logic value of '1'.

Figure 19:
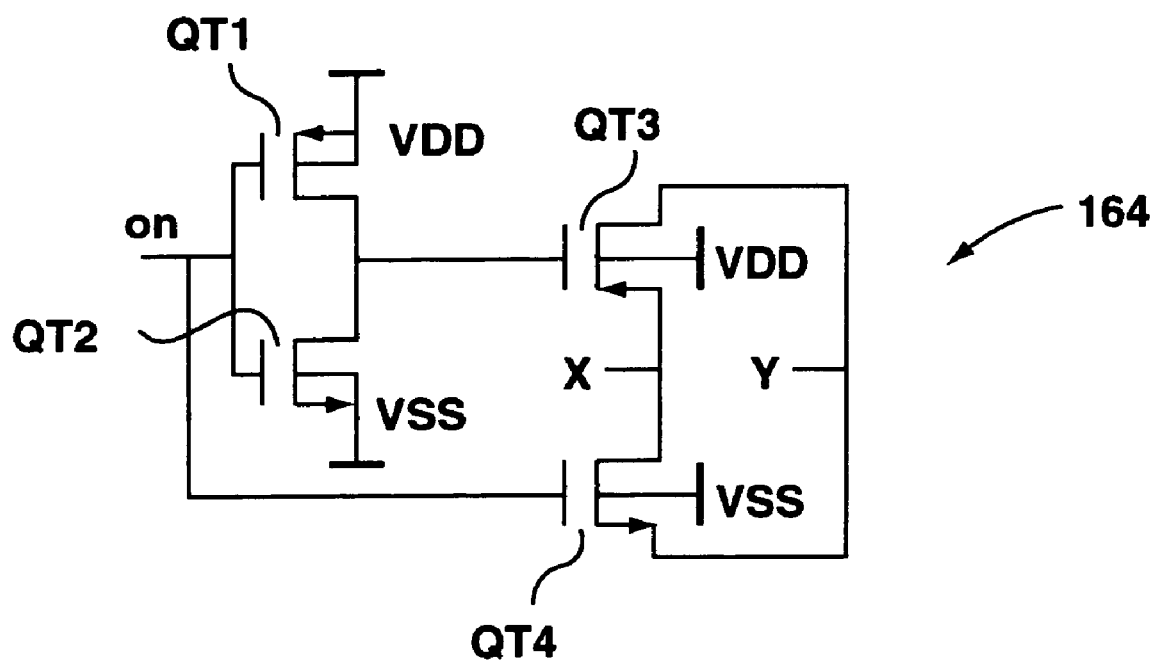
FIG. 19 is a schematic of the transmission gate used in the variable ring oscillator of FIG. 18.

Referring to FIG. 19, the transmission gate circuitry 164 used for each transmission gate in the variable ring oscillator 62 is shown. The transmission gate circuitry 164 comprises a network of four transistors QT1, QT2, QT3 and QT4 and has an input signal X, an output signal Y and a control signal ON. When the control signal ON has a digital logic value of '1', the value of the output signal Y is equal to the value of the input signal X. However, when the control signal ON has a digital logic value of '0', the output signal Y is disconnected from the input signal X and the transmission gate appears as an open circuit.

Before each sub-circuit is described, the test sequence will be discussed. The test sequence consists of nine test states. The duration of each test state is 32 periods of the clock signal 90 since the frequency of the reduced clock signal 104 is 1/32 of the frequency of the clock signal 90. The test circuit 14 cycles through each test state in the sequence shown in Table 1. At the end of test state 8, the test cycles back to test state 0. There could also be many more or fewer test cases as desired. The length of time in each test state could also be changed but should be long enough to allow the test unit 12 to synchronize to the frequency in the test result signal 34 (i.e. if more sophisticated methods are used in the test unit 12, then a shorter period of time for each test state could be used).

TABLE 1

Sequence of Test States

| Test State | Test type | State signals with value of '1' | Output of Variable Ring Oscillator |
|---|---|---|---|
| 0 | Null Test | NS2, NS3, NS6 | Disabled |
| 1 | Free Running Test Signal | NS2, NS3, NS6 | Enabled |
| 2 | Capacitance Test | S2, NS3, NS6 | Enabled |
| 3 | 3 × 2 Capacitance Test | S3, NS2, NS6 | Enabled |
| 4 | Resistance Test | S4, NS2, NS3, NS6 | Enabled |
| 5 | 5 × 2 Resistance Test | S5, NS2, NS3, NS6 | Enabled |
| 6 | Propagation Delay | S6, NS2, NS3 | Enabled |
| 7 | Free Running Test Signal | NS2, NS3, NS6 | Enabled |
| 8 | Null Test | NS2, NS3, NS6 | Disabled |

During test states 0 and 8, the test result signal 34 is not sent to the test unit 12. This allows the test unit 12 to synchronize to the testing that is being performed by the test circuit 14. During test states 1 and 7, there are five inverters in the variable ring oscillator 62 and no load. During test states 2 and 3, capacitance is measured using the two circuit topologies shown in FIGS. 21 and 22. During test states 4 and 5, resistance is measured using the two circuit topologies shown in FIGS. 23 and 24. During test state 6, gate delay is evaluated by increasing the number of inverters in the variable ring oscillator 62 to seven. This increases the period of the oscillation of the variable ring oscillator 62 since the delay in signal propagation is increased. The specific sub-circuits that were switched into the variable ring oscillator 62 in each test state to allow for parameter measurement will now be described.

Figure 20:
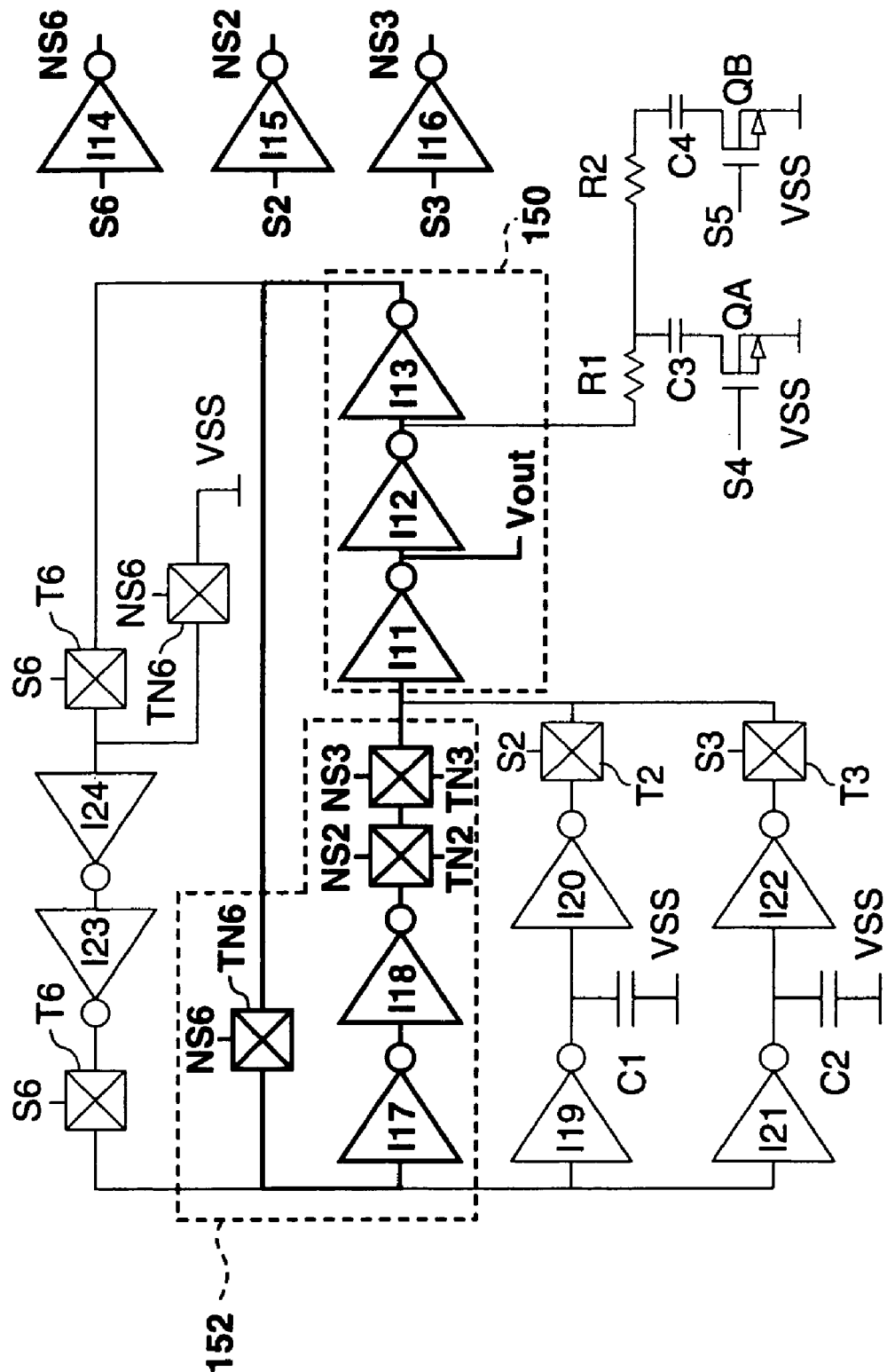
FIG. 20 is a schematic of the elements of the variable ring oscillator of FIG. 18 that are enabled during test state 1.

Referring to FIG. 20, during test state 1, the state signals NS2, NS3 and NS6 have a digital logic value of '1'. Accordingly, the components of the variable ring oscillator 62 which are enabled during test state 1 are the transmission gates TN2, TN3 and TN6 and the sub-circuit 152 which comprises inverters I17 and I18. The sub-circuit 152 is connected to the base ring oscillator 150 such that the variable ring oscillator 62 now comprises five inverters. Accordingly the frequency of oscillation for the variable ring oscillator 62 is $1/(2*5*\tau_{inv})$ Hz where $\tau_{inv}$ is the delay for each inverter I11, I12, I13, I14 and I15 assuming that each inverter has similar parasitic capacitive loads. The frequency of oscillation for the variable ring oscillator 62 could be measured in this test state and used along with test state 6 to measure the parameter of gate delay.

Figure 21:
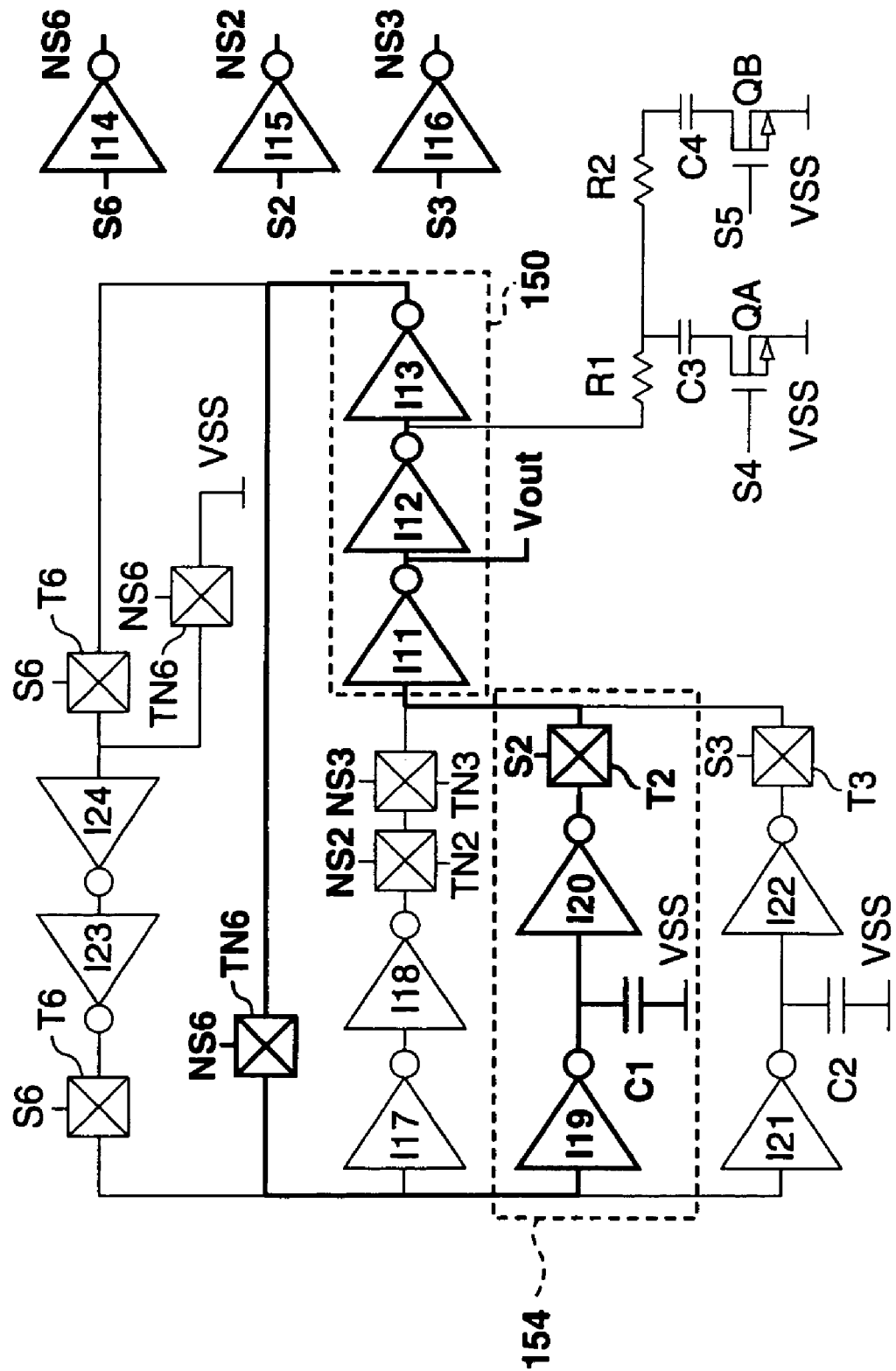
FIG. 21 is a schematic of the elements of the variable ring oscillator of FIG. 18 that are enabled during test state 2.

Reference is next made to FIG. 21 which shows the elements of the variable ring oscillator 62 that are enabled during test state 2 when the state signals S2 and NS6 have a digital logic value of '1'. In this test state, the transmission gates T2 and TN6 are enabled and the sub-circuit 154 is connected to the base ring oscillator 150 such that the variable ring oscillator 62 comprises five inverters I11, I12, I13, I19 and I20 and has a capacitor C1 as a load. The capacitance of the capacitor C1 is chosen to be much larger than the parasitic loads of each inverter I11, I12, I13, I19 and I20 so that the frequency of oscillation for the variable ring oscillator 62 is $1/(k*(R_{lump}*C1))$ Hz (following the guidelines outlined for FIG. 17a).

Figure 22:
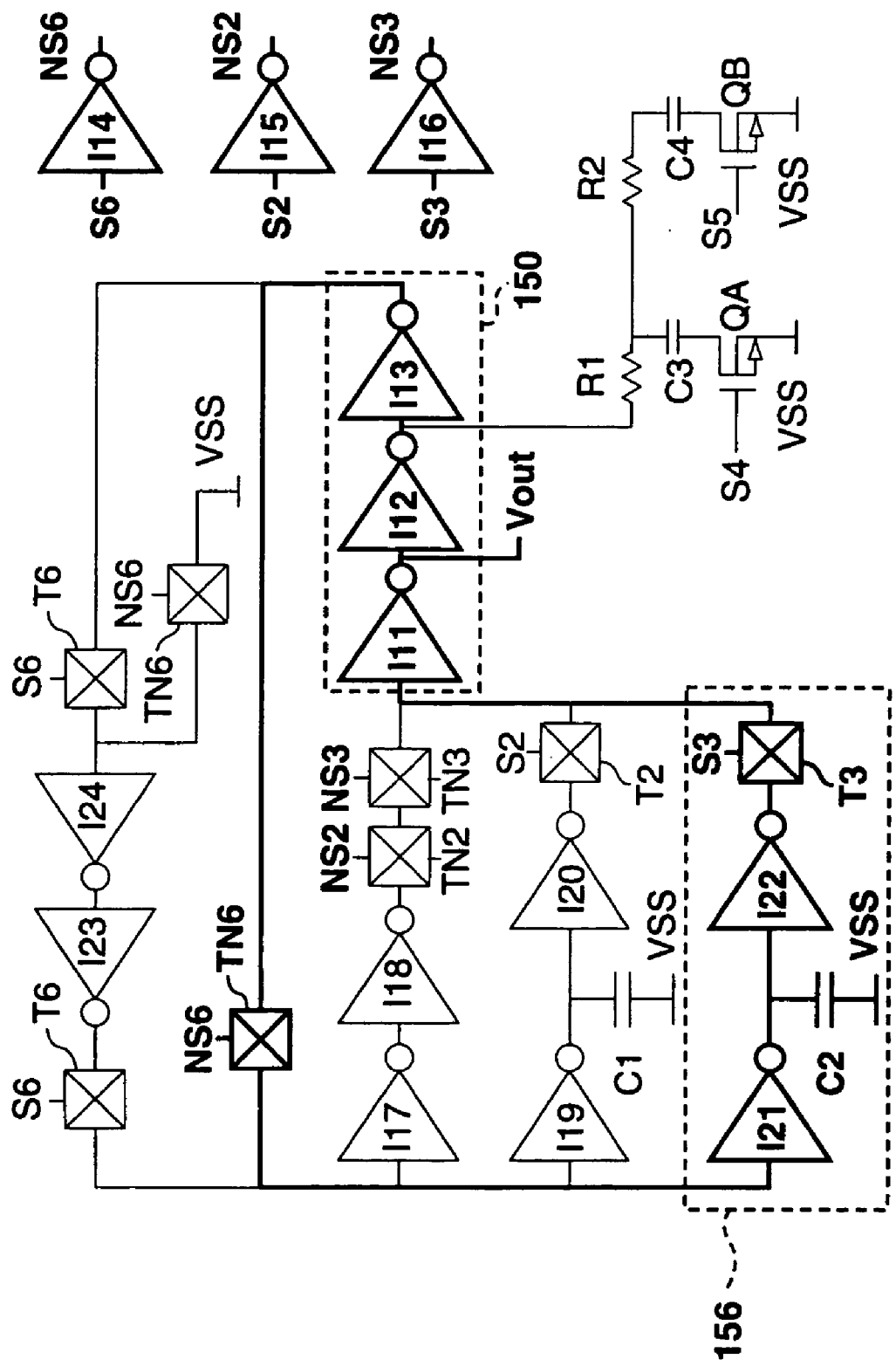
FIG. 22 is a schematic of the elements of the variable ring oscillator of FIG. 18 that are enabled during test state 3.

Reference is next made to FIG. 22 which shows the elements of the variable ring oscillator 62 that are enabled during test state 3 when the state signals S3 and NS6 have a digital logic value of '1'. In this test state, the transmission gates T3 and TN6 are enabled and the sub-circuit 156 is connected to the base ring oscillator 150 such that the variable ring oscillator 62 comprises five inverters I11, I12, I13, I21 and I22 and has a capacitor C2 as a load. Once again, the capacitance of the capacitor C2 is chosen to be much larger than the parasitic load of each inverter I11, I12, I13, I21 and I22 so that the frequency of oscillation for the variable ring oscillator 62 is $1/(k*(R_{lump}*C2))$ Hz. The capacitance of the capacitor C2 must also be chosen to be different enough from the capacitance of the capacitor C1, in FIG. 21, so that the frequency of oscillation of the variable ring oscillator 62 can be discriminated against when comparing the test result signals obtained during test states 2 and 3.

To calculate the actual ratio of the capacitance values, based on the fabrication process, one uses equations 2 and 3 adjusted for the loads shown in FIGS. 21 and 22. The equations become:

$$f_{osc1}=1/(k*(R_{lump}*CL1)) \quad (4)$$

$$f_{osc2}=1/(k*(R_{lump}*CL2)) \quad (5)$$

Dividing equation 4 by equation 5 results in equation 6:

$$f_{osc1}/f_{osc2}=CL2/CL1 \quad (6)$$

This ratio can be calculated given the fact that $f_{osc1}$ and $f_{osc2}$ are measured. Furthermore, the geometry of the physical layout of the variable ring oscillator 62 allows one to choose a value for the ratio of CL2/CL1. For example, one may choose to make CL2 twice as large as CL1. Therefore, the ratio of the oscillation frequencies $f_{osc1}$ and $f_{osc2}$ should also be two. Thus, the fabrication of the variable ring oscillator 62 on the wafer 16 can be checked against the original design to see if there is a match by calculating the ratio for the oscillation frequencies ($f_{osc1}/f_{osc2}$) and comparing this ratio to the expected value of the ratio of CL2/CL1 based on the design of the variable ring oscillator 62. If there is no match between the ratio of the oscillation frequencies ($f_{osc1}/f_{osc2}$) and the expected ratio of the design values of the capacitances (CL2/CL1), then this indicates that there is a problem with the fabrication process. One may also simulate the performance of the circuit 12 using a circuit simulation program, such as CADENCE™ to determine the value of the oscillation frequency given the circuit configuration. This simulated oscillation frequency value can then be compared to the measured frequency of oscillation to see if the fabricated circuit works as it should. If these two oscillation frequencies do not match then there may be an error in the fabrication process.

Figure 23:
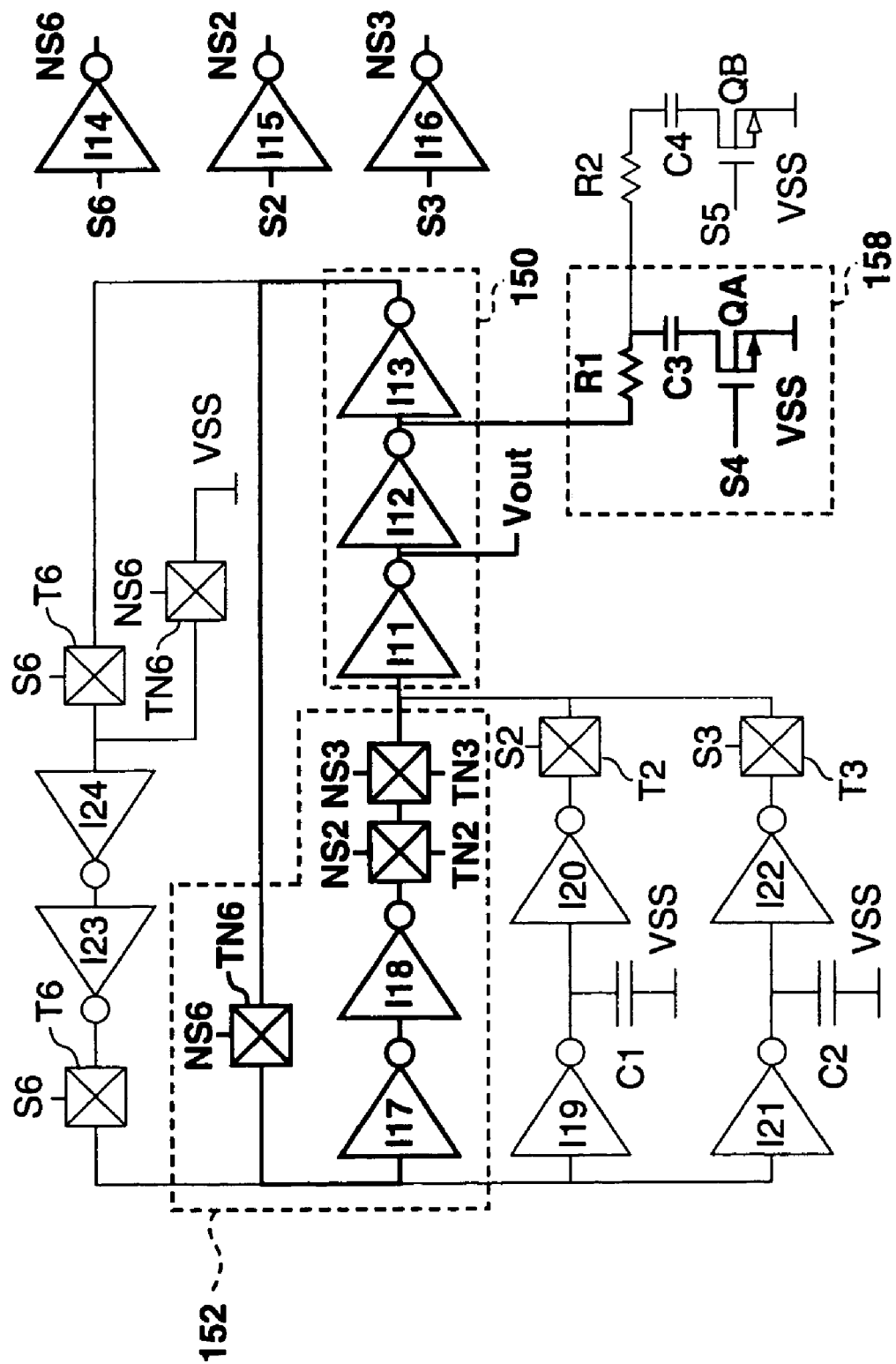
FIG. 23 is a schematic of the elements of the variable ring oscillator of FIG. 18 that are enabled during test state 4.

Reference is next made to FIG. 23 which shows the elements of the variable ring oscillator 62 that are enabled during test state 4 in which the state signals S4, NS2, NS3 and NS6 have a digital logic value of '1'. In this case, the transmission gates TN2, TN3 and TN6, and the transistor QA are enabled so that the sub-circuits 152 and 158 are connected to the base ring oscillator 150. Therefore, the variable ring oscillator 62 comprises five inverters I11, I12, I13, I17 and I18 and has a load consisting of a resistor R1 in series with a capacitor C3. The impedance of this load is chosen such that it is much larger than the parasitic loads of each inverter I11, I12, I13, I21 and I22 in the variable ring oscillator 62. The delay of the variable ring oscillator 62 is thus determined by the serial combination of the resistor R1 and the capacitor C3. The frequency of operation of the variable ring oscillator 62 is $1/(k*R1*C3)$ Hz (following the guidelines outlined for FIG. 17a and replacing $R_{lump}$ with R1). Therefore the frequency of oscillation is proportional to the resistance of the resistor R1.

Figure 24:
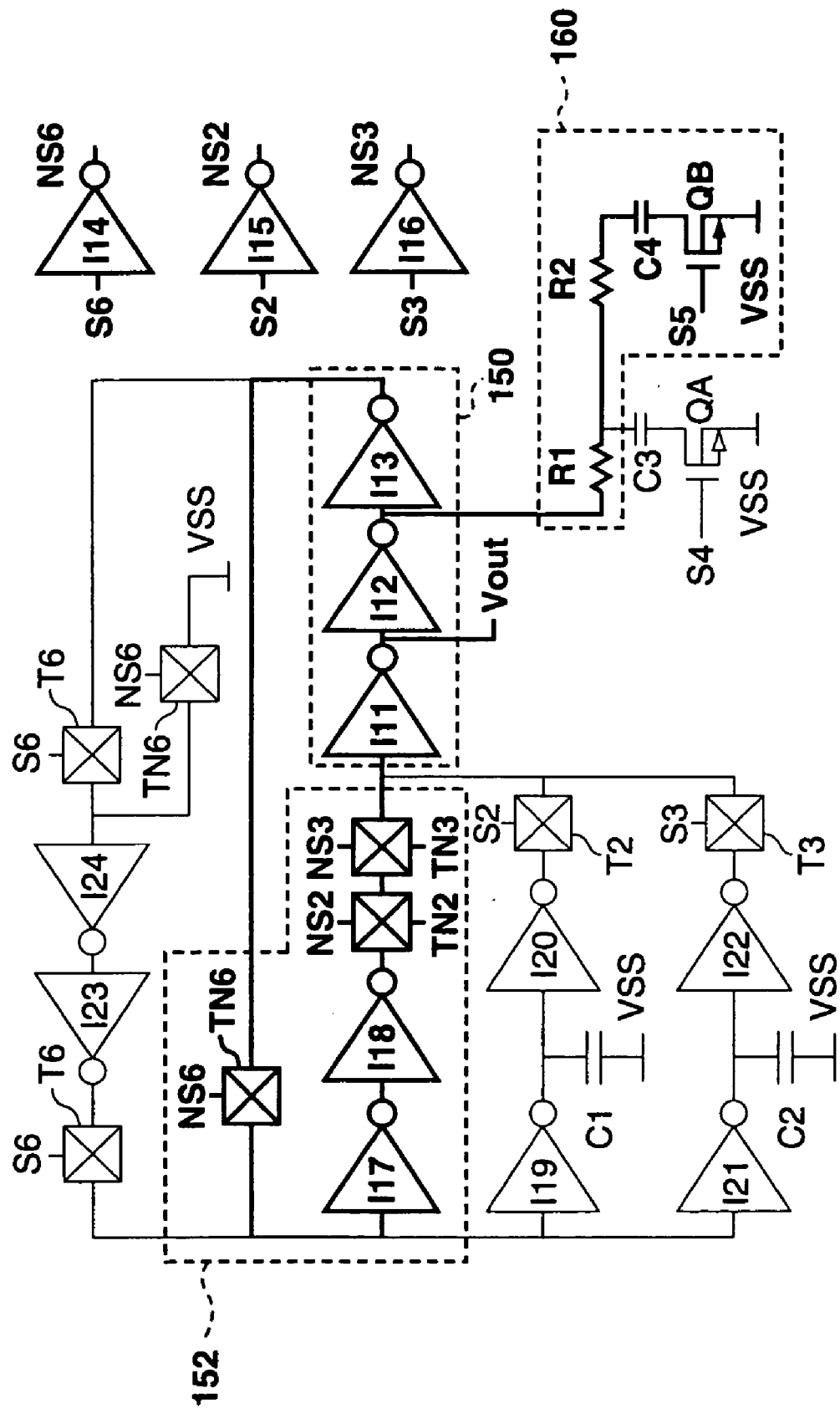
FIG. 24 is a schematic of the elements of the variable ring oscillator of FIG. 18 that are enabled during test state 5.

Reference is next made to FIG. 24 which shows the elements of the variable ring oscillator 62 that are enabled during test state 5 in which the state signals S5, NS2, NS3 and NS6 have a digital logic value of '1'. In this case, the transmission gates TN2, TN3 and TN6 and the transistor QB are enabled so that the sub-circuits 152 and 160 are connected to the base ring oscillator 150. The variable ring oscillator 62 now comprises five inverters I11, I12, I13, I17 and I18 and has a load consisting of two resistors R1 and R2 and a capacitor C4. Once again, the impedance of the load is chosen such that it is much larger than the parasitic loads of the each inverters I11, I12, I13, I17 and I18 in the variable ring oscillator 62. The delay of the variable ring oscillator 62 is thus determined by the serial combination of the resistors R1 and R2 and the capacitor C4 such that the frequency of operation of the variable ring oscillator 62 is $1/(k*(R1+R2)*C4)$ Hz. Therefore, the frequency of oscillation is proportional to the sum of the resistances of the resistors R1 and R2. Once again, as in the capacitance parameter test, the values of the resistors R1 and R2 should be large enough to allow the oscillation frequencies to be resolved.

To calculate the ratio of the resistance values, based on the fabrication process, one uses equations 2 and 3 adjusted for the loads shown in FIGS. 23 and 24. The equations become:

$$f_{osc1}=1/(k*(R1*CL3)) \quad (7)$$

$$f_{osc2}=1/(k*((R1+R2)*CL4)) \quad (8)$$

Dividing equation 7 by equation 8 results in equation 9:

$$f_{osc1}/f_{osc2}=((R1+R2)/R1)*(CL4/CL3) \quad (9)$$

This ratio can be calculated given the fact that $f_{osc1}$ and $f_{osc2}$ are measured. Furthermore, the geometry of the physical layout of the variable ring oscillator 62 allows one to choose a value for the ratios of (R1+R2)/R1 and CL4/CL3. For example, one may choose to make CL4 equal to CL3. Therefore, the ratio of the oscillation frequencies ($f_{osc1}/f_{osc2}$) should be equal to the ratio of (R1+R2)/R2. If this is not confirmed during testing, then this indicates that there is a problem with the fabrication process.

Figure 25:
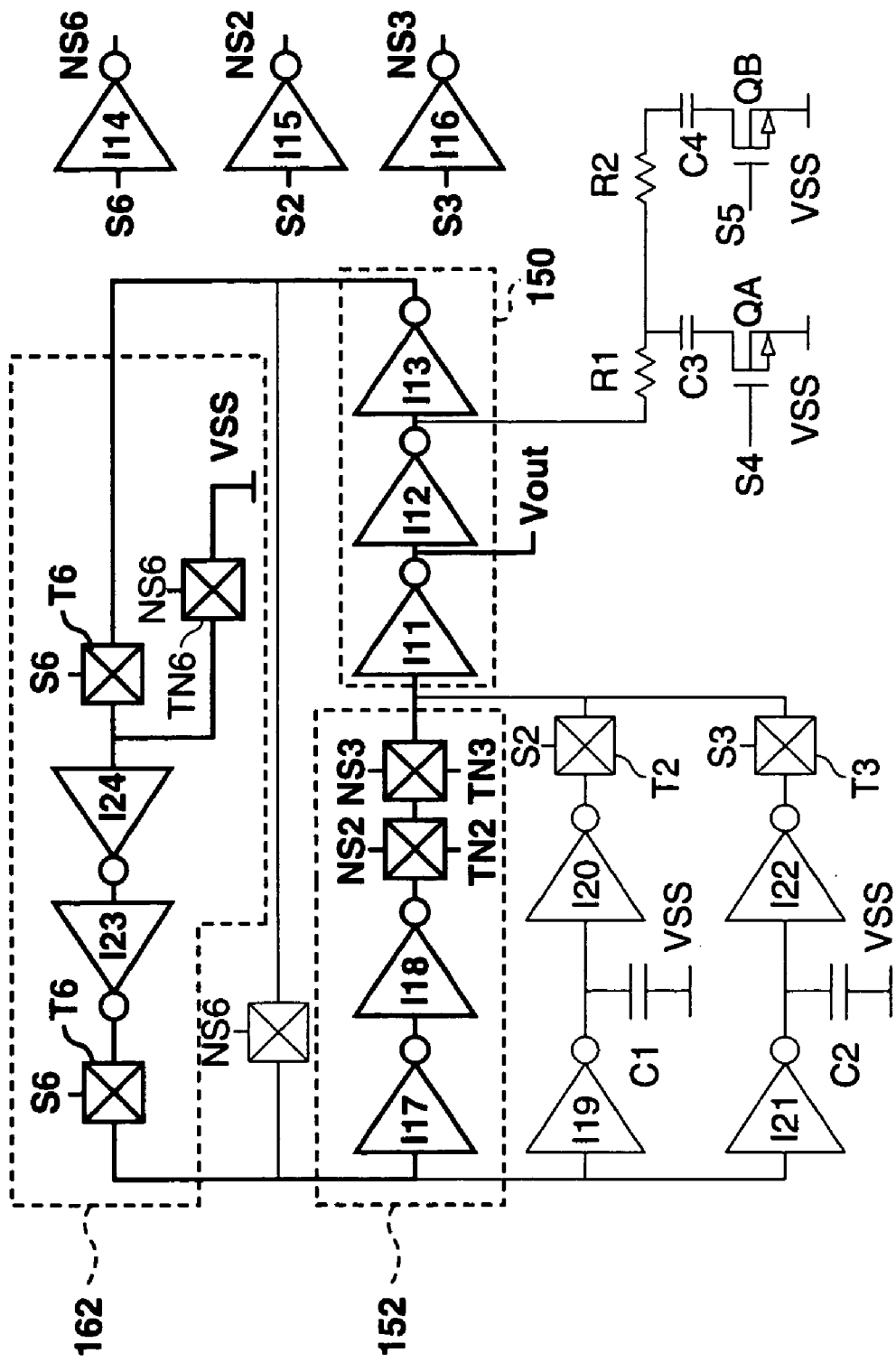
FIG. 25 is a schematic of the elements of the variable ring oscillator of FIG. 18 that are enabled during test state 6.

Reference is next made to FIG. 25 which shows the elements of the variable ring oscillator 62 that are enabled during test state 6 in which the state signals S6, NS2 and NS3 have a digital logic value of '1'. In this case, the transmission gates T6, TN2 and TN3 are enabled so that the sub-circuits 152 and 162 are connected to the base ring oscillator 150. The variable ring oscillator 62 now comprises seven inverters I11, I12, I13, I17, I18, I23 and I24. Assuming that each inverter has the same parasitic load, the frequency of oscillation for the variable ring oscillator 62 will be $1/(7*\tau_{inv})$ Hz where $\tau_{inv}$ is the delay of one of the inverters. This frequency of oscillation can then be compared to the frequency of oscillation measured during test state 1 in which the variable ring oscillator 62 comprised five inverters. The shift in oscillation frequency should be proportional to the addition of the two inverters during test state 6.

To calculate the propagation delay of a single inverter, the oscillation period $\tau_5$ ($\tau_5=5*\tau_{inv}$) when the variable ring oscillator 62 comprises five inverters is measured. Next the oscillation period $\tau_7$ ($\tau_7=7*\tau_{inv}$) when the variable ring oscillator 62 comprises seven inverters is measured. The propagation delay of an inverter is then equal to $(\tau_7-\tau_5)/2$. One can then compare this measured propagation delay of a single inverter to that which would have been expected based on simulations to determine if there is an error in the fabrication process.

Figure 26:
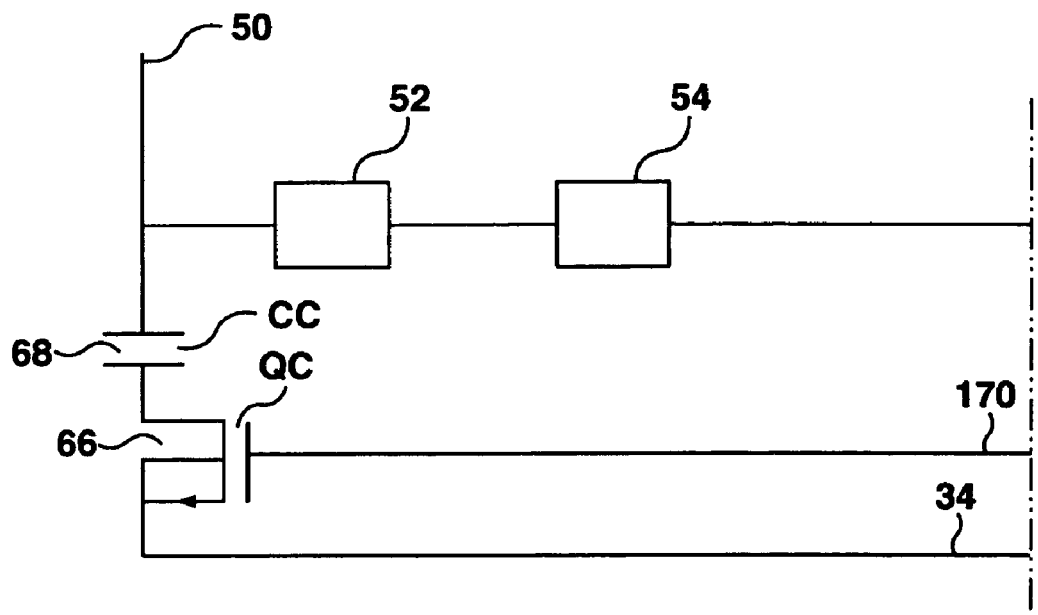
FIG. 26 is a schematic of the coupler to the antenna.

Referring now to FIG. 26, an embodiment of the synchronization element 66 comprising transistor QC and the coupler 68 comprising capacitor CC is shown. The transistor QC is used to couple energy from the test result signal 34 through capacitor CC to the antenna 50 which is transmitted back to the test unit 12. The source of the transistor QC is connected to the gate of the transistor QC such that the transistor QC acts as a resistor when enabled. The test result signal 34, for a given test state, is coupled to the source of the transistor QC. The transistor QC is enabled by an antenna couple enable signal 170 which is derived from a combination of the state signals S0 or S8 of sequencer 60, such as the logical XNOR of state signals S0 and S8, since these signals have a digital value of '1' when there is no testing being done (i.e. refer to Table 1). When the antenna couple enable signal 170 has a digital logic value of '1', the transistor QC is enabled which allows the test result signal 34 to be applied to the antenna 50 and radiated towards the test unit 12. When the antenna couple enable signal 170 has a digital logic value of '0', the transistor QC is disabled and the test result signal 34 cannot be applied to the antenna 50 and no signal is radiated towards the test unit 12. Hence the coupler 68 and the test result signal 34 are synchronized to the antenna couple enable signal 170. The capacitor CC acts as a coupling capacitor to remove DC energy from the test result signal 34 and couple the test result signal 34 to the antenna 50.

Figure 27:
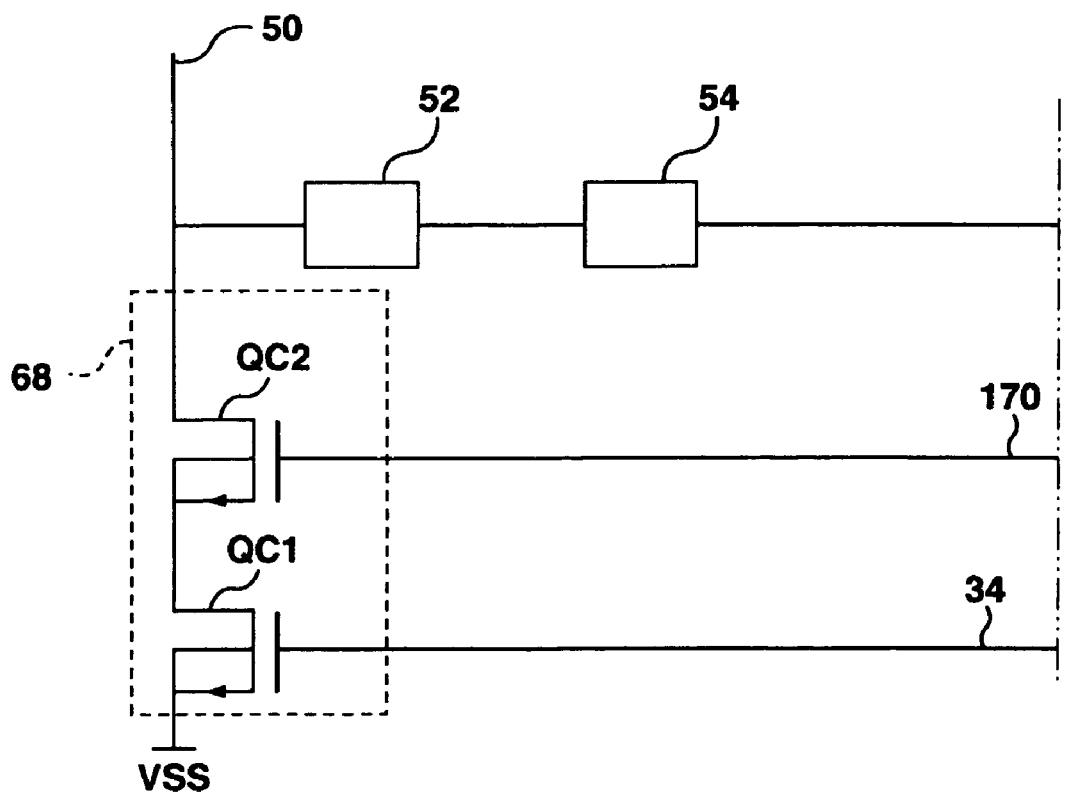
FIG. 27 is a schematic of an alternative embodiment of the coupler to the antenna.

An alternative embodiment for transmitting the test result signal 34 to the test unit 12 involves modulating the impedance of the antenna 50 to re-radiate an RF signal that contains the information of the test result signal 34. Referring to FIG. 27, a partial view of the test circuit 14 shows that the alternative embodiment of the coupler 68 includes synchronization and coupling features. The coupler 68 includes two transistors QC1 and QC2 that are connected in series. The transistor QC2 acts as both a synchronization element and as a coupler to couple the transistor QC1, the impedance of which encodes the test result signal 34, to the antenna 50. The transistor QC2 is controlled by the antenna couple enable signal 170 in the same fashion described for the embodiment shown in FIG. 26. The test result signal 34 is used to control the transistor QC1 which is connected such that it behaves like a resistor when enabled. When the test result signal 34 has a digital logic value of '1', the transistor QC1 is enabled and increases the resistance of the antenna 50. Conversely, when the test result signal 34 has a digital logic value of '0', the transistor QC1 is disabled and the impedance of the antenna 50 returns to its original value. Since the periodic transition from a digital logic value of '1' to a digital logic value of '0' and vice-versa indicates the frequency of the test result signal 34, the frequency of the impedance modulation of the antenna 50 encodes the frequency information contained within the test result signal 34.

In either of the aforementioned embodiments, if the test result signal 34 were coupled to the antenna 50 without the antenna couple enable signal 170, the test unit 12 would see a series of frequencies but would not be able to easily determine which test state the test circuit 14 is currently in. To allow for synchronization between the test unit 12 and the test circuit 14, the sequencer 60 also switches the synchronization element 66 shown in FIG. 26 or the transistor QC2 in the coupler 68 shown in FIG. 27 so that before each repetition of the test sequence, i.e. during test state 0 or 8, the coupler 68 is disabled so that no signal is radiated towards the test unit 12. The test unit 12 may therefore synchronize to the test result signal 34 by the absence of reception of the test result signal 34 from the test circuit 14.

In an alternative embodiment, the test circuit 14 can be extended to test the functionality of individual sub-circuits contained within the IC 18 (i.e. a sub-circuit of IC 18) as long as these individual sub-circuits do not require too much power to operate. For example, a functional test may be performed on memory wherein the sequencer 60 selectively provides a digital logic value of '1' or '0' to a series of memory cells. Each memory cell could then be probed and a frequency f1 transmitted to the test unit 12 if the memory cell held a digital logic value of '1' or a frequency f2 transmitted to the test unit 12 if the memory cell held a digital logic value of '0'. The test unit 12 would then evaluate whether the received test result signal 34 contained the correct data.

Figure 28:
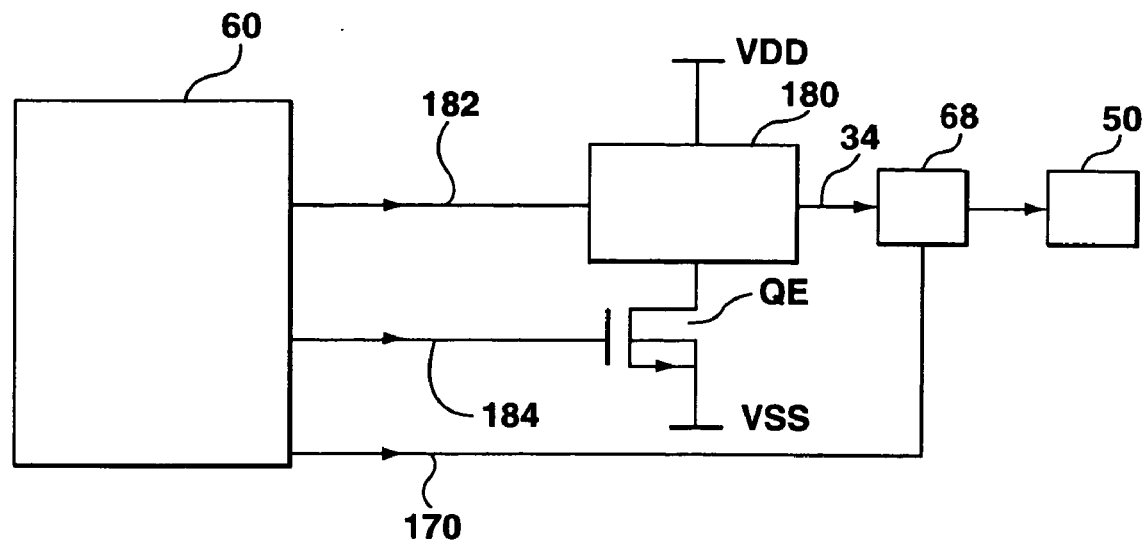
FIG. 28 is a schematic of a portion of a modified test circuit for testing circuits within the IC.

Referring to FIG. 28, a modification of the test circuit 14 which would allow the test circuit 14 to test a sub-circuit 180 within the IC 18 is shown. This embodiment includes the circuitry shown in FIG. 7 as well as an enable transistor QE connected to ground VSS, a test signal 182 and an enable test sub-circuit signal 184. The source voltage VDD which is used to power the sub-circuit 180 is provided by the voltage rectifier 52. The power of the sub-circuit 180 is provided by the enable test sub-circuit signal 184 that grounds the sub-circuit 180. This grounding is required because a ground path is needed before the sub-circuit 180 can be powered. This embodiment is preferable because there is a low voltage drop across the transistor QE. In this configuration, the sequencer 60 is modified to provide the enable test sub-circuit signal 184 as well as the test signal 182 that is used to test the functionality of the sub-circuit 180. The test signal 182 can be used to set one or many logic states within the sub-circuit 180. The resulting output signal of the sub-circuit 180, i.e. the test result signal 34, is then sent to the coupler 68. The coupler 68 also receives the antenna couple enable signal 170 which was previously described in the alternative embodiment shown in FIG. 27 (alternatively, the embodiment having the synchronization element 66 and the coupler 68 shown in FIG. 26 may also be used for synchronization and coupling). The test result signal 34 may then be transmitted to the test unit 12 where the test result signal 34 may be evaluated to determine whether the sub-circuit 180 behaved correctly.

Figure 29:
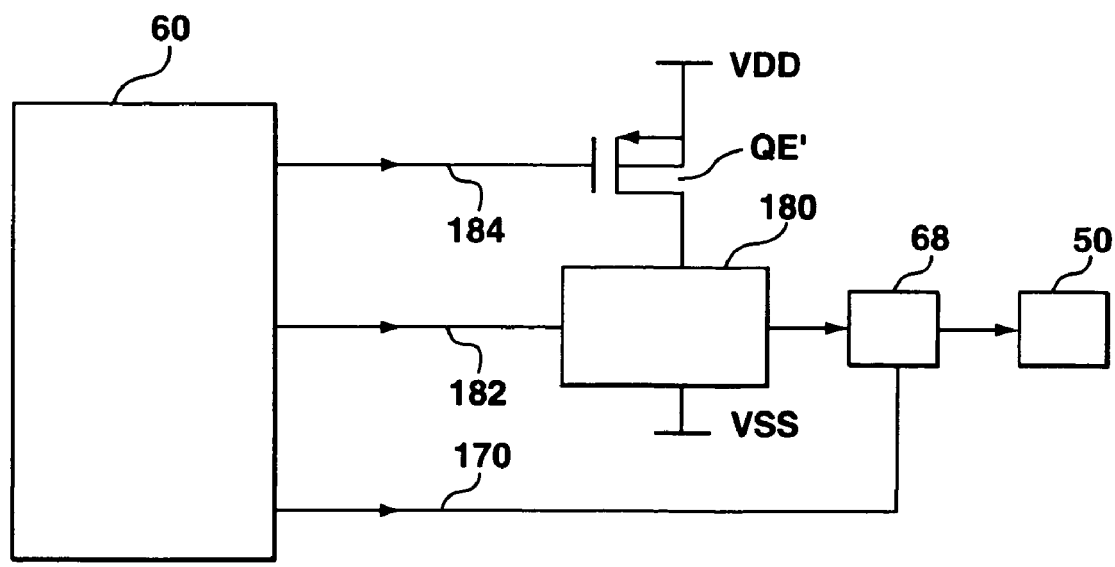
FIG. 29 is a schematic of a portion of an alternate embodiment of a modified test circuit for testing circuits within the IC.

FIG. 29 shows an alternate embodiment of test circuit 14 allowing the test circuit 14 to test the sub-circuit 180 within the IC 18 and includes all of the components shown in FIG. 28 with one exception; the sub-circuit 180 is powered differently. In this embodiment, the enable transistor QE' is connected to the supply voltage VDD and the sub-circuit 180 is connected to ground VSS. When the enable test sub-circuit signal 184 has a digital logic value of '0', the enable transistor QE will turn on and connect the supply voltage VDD to the sub-circuit 180. The operation of this modified version of the test circuit 14 would otherwise operate as previously described for the embodiment shown in FIG. 28.

Since the test circuit 14 was designed with a minimal number of transistors and requires a minimal amount of chip area, the test circuit 14 may be fabricated with one or two metallization layers whereas current state of the art ICs require as many as 7 layers of metallization. Alternatively, more metallization layers could be used in the fabrication of the test circuit 14. However, since the test circuit 14 can be fabricated with two metallization layers (or alternatively one metallization layer and one poly-silicon interconnect layer) wireless testing may be performed using the wireless IC test system 10 before all of the metallization layers for the IC 18 have been deposited. Furthermore, this testing may be continued throughout the manufacturing process as other layers are added to the IC 18. Although the IC 18 hasn't been completed, most of the sub-circuits within the IC 18 can be modularized for testing. In addition, each new metallization layer may be simply switched into and out of the test circuit 14 during testing. In this case, an absence of the test result signal 34 may be used to indicate a functional failure in the metallization layer. Furthermore, the addition of later metallization and oxide layers could be used to increase the value of the resistors and the capacitors used in the test circuit 14 which would allow the test unit 12 to follow the growth of the IC 18 right up to completion.

A simulation of the entire test circuit 14 was done using CADENCE™ which is a widely used IC design CAD tool. The simulation was done on the following IC technologies and supply voltages: 0.5 micron with 5 V, 0.35 micron with 3.5 V, 0.25 micron with 2.5 V and 0.18 micron with 2 V. The capacitance parameter test was simulated using two capacitors with values of 200 fF and 400 fF and two resistors with values of 5 k$\Omega$ and 10 k$\Omega$. A Discrete Fourier Transform integrated over a test interval of one microsecond was used to observe the simulated test results. The ability to evaluate test results in such a short period of time is in contrast to conventional probe tests in which a 101 ring oscillator operating at approximately 100 MHz results in a minimum requirement of 10 microseconds to obtain a test result.

Figure 30A:
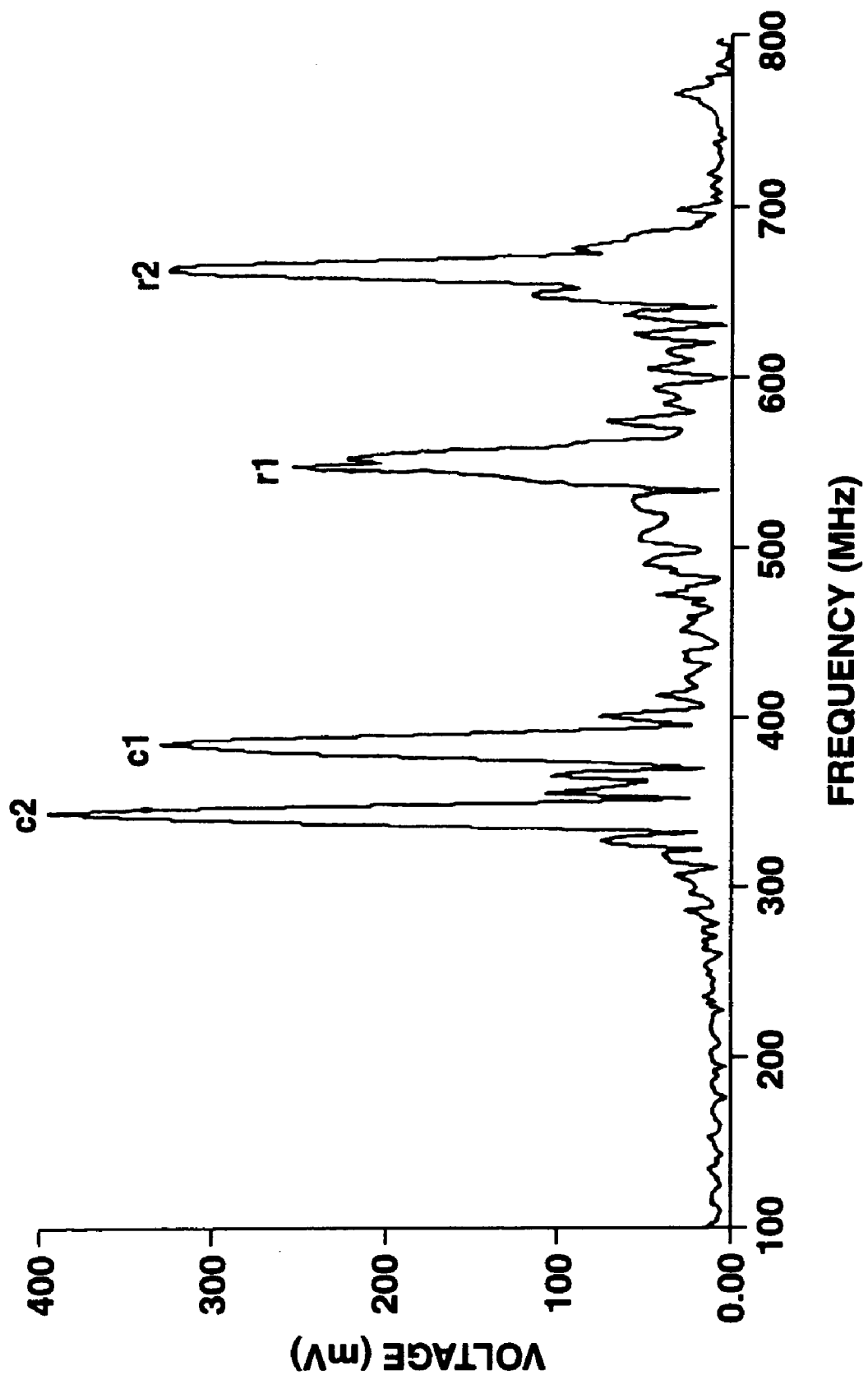
FIG. 30a is a spectrum of a simulation result obtained from testing the test circuit that shows the frequency resolution when measuring capacitance and resistance.
Figure 30B:
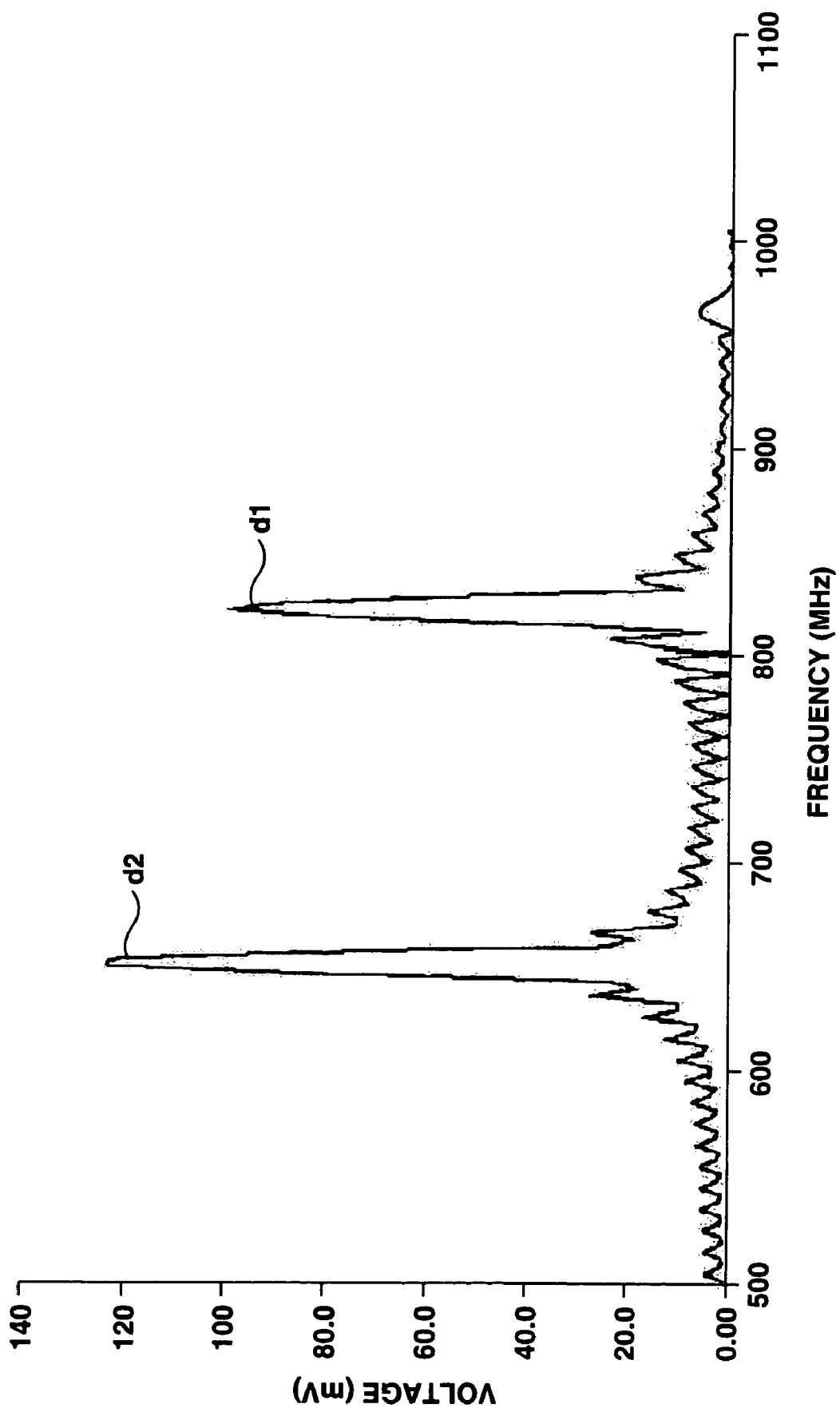
FIG. 30b is a spectrum of a simulation result obtained from testing the test circuit that shows the frequency resolution when measuring gate delay; and, FIG. 31 is a graph of simulation results showing ring oscillator frequency versus supply voltage for various IC technologies.

A spectrum of test results is shown in FIGS. 30a and 30b. Referring to FIG. 30a, for capacitance, there was a distinct difference between the two frequencies exhibited (labeled c1 and c2) by the test circuit 14 when the variable ring oscillator 62 was loaded first by sub-circuit 154 and then by sub-circuit 156. The resistance parameter test results also showed distinct oscillation frequencies (the frequencies are labeled r1 and r2). FIG. 30b shows the simulation results for the gate delay parameter test. In this case, there was also two discernible oscillation frequencies d1 and d2. The extra delay, and hence lower oscillation frequency, due to the two extra inverters is labeled d2.

Figure 31:
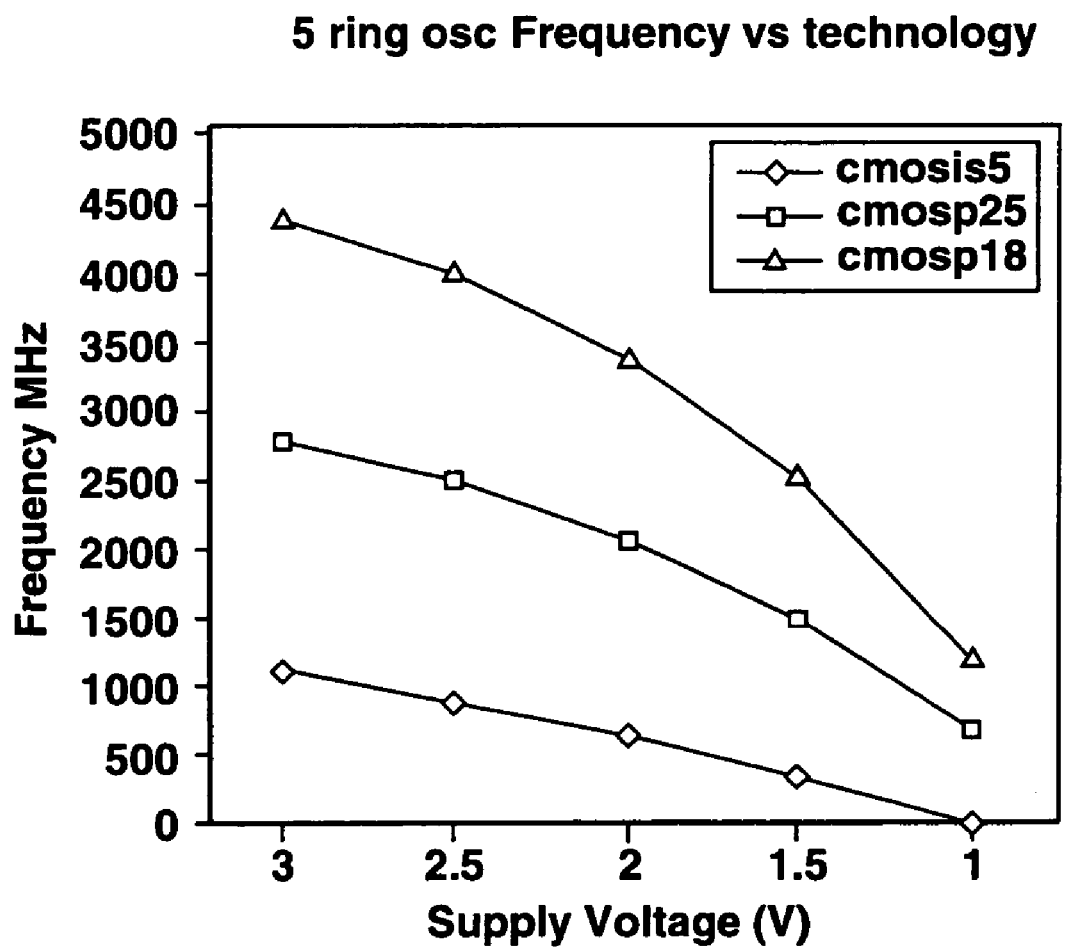

Reference is next made to FIG. 31 which is a graph of simulated test results plotting the oscillation frequency of the variable ring oscillator 62 versus supply voltage VDD for various IC technologies. This Figure shows that the test circuit 14 is scalable across different supply voltages (1, 1.5, 2, 2.5 and 3 V) as well as different IC technologies (0.18, 0.25 and 0.5 microns) while the variable ring oscillator 62 was oscillating at frequencies on the order of 500 MHz to 4.5 GHz. This shows that the test circuit 14 is highly flexible and may be used to test ICs 18 at their nominal clock rates which are currently in the Gigahertz range. Furthermore, the test circuit 14 may be used in testing during the manufacture of many different ICs ranging from analog to digital devices.

During simulation it was also found that the variable ring oscillator 62 had a smooth transition without any glitches when switching from a given test state to the next test state. Glitches are undesirable since they would introduce a startup time (i.e. delay), create noise and may also cause power surges which could cause very large increases in the power consumed by the test circuit 14. If different ring oscillators were used for each test state then glitches may result and there may have to be some circuitry in the test circuit 14 adapted to avoid transients in the test results. The synchronization issue would also affect the test unit 12 and it would be likely that the bandwidth of the receiver of the test unit 12 would have to be substantially increased to accommodate this synchronization issue. However, simulations showed that glitches are not an issue with the test circuit 14.

One implementation of the test circuit 14 was done for exemplary purposes, with standard VLSI CAD tools, using a 5 layer 0.25 micron, 2.5 V, single n-well CMOS process. The final layout, without the antenna, was approximately 150 by 50 micrometers and comprised approximately 250 transistors. This results in a chip area of 7,500 $\mu m^2$ which is approximately $\frac{1}{10,000}^{th}$ the area of a Pentium class IC. The test circuit 14 dissipates approximately 1 mW of power which is $\frac{1}{20,000}^{th}$ of the power dissipation of a Pentium class IC.

The wireless IC test system described herein can be further altered or modified within the scope of the original invention. For instance, more or fewer components or groups of components may be used in the parametric testing of the IC 18. Furthermore, other test methods may be used by the test circuit 14.

It should be understood that various modifications can be made to the preferred embodiments described and illustrated herein, without departing from the present invention, the scope of which is defined in the appended claims.

I claim:

1. A test circuit for testing an integrated circuit on a wafer, the test circuit formed on the wafer with the integrated circuit, the test circuit comprising:
   a) a variable ring oscillator circuit including:
      i) a base ring oscillator circuit;
      ii) a plurality of sub-circuits selectively coupled to the base ring oscillator circuit; and,
      iii) a plurality of switching elements for selectively coupling at least one of the plurality of sub-circuits to the base ring oscillator circuit; and,
   b) a control circuit to enable at least one of the plurality of switching elements to selectively couple at least one of the sub-circuits to the base ring oscillator circuit to produce different versions of the variable ring oscillator circuit, the test circuit conducts a separate test of the integrated circuit for at least one of the versions of the variable ring oscillator circuit.

2. The test circuit of claim 1 wherein each test conducted by the test circuit is a parametric test.

3. The test circuit of claim 2 wherein the sub-circuits when coupled to the base ring oscillator circuit change the frequency of oscillation of the variable ring oscillator circuit.

4. The test circuit of claim 3 wherein at least one sub-circuit comprises a capacitive load to change the frequency of oscillation of the variable ring oscillator circuit.

5. The test circuit of claim 4 wherein the capacitive load comprises at least one capacitor.

6. The test circuit of claim 3 wherein at least one sub-circuit comprises a capacitive load and a resistive load to change the frequency of oscillation of the variable ring oscillator circuit.

7. The test circuit of claim 6 wherein at least one sub circuit comprises a delay element to change the frequency of oscillation of the variable ring oscillator circuit.

8. The test circuit of claim 7 wherein the delay element comprises at least one inverter.

9. The test circuit of claim 8 wherein each inverter is a standard CMOS inverter.

10. The test circuit of claim 6 wherein the capacitive load comprises at least one capacitor and the resistive load comprises at least one resistor.

11. The test circuit of claim 1 wherein the control circuit comprises a sequencer to selectively couple the sub-circuits to the variable ring oscillator circuit to produce a series of test states.

12. The test circuit of claim 11 wherein the control circuit further comprises a second ring oscillator adapted to provide a first clock signal, and a divider coupled to the second ring oscillator and the sequencer and adapted to provide a second clock signal, wherein the second clock signal is provided to the sequencer so that the sequencer can provide a series of test state signals to the variable ring oscillator circuit and plurality of sub-circuits.

13. The test circuit of claim 1 wherein the test circuit is formed on the wafer with at least two metallization layers of the integrated circuit.

14. The test circuit of claim 1 wherein the test circuit is formed on the wafer with at least one metallization layer and one polysilicon layer of the integrated circuit.

15. The test circuit of claim 1 wherein the test circuit produces a test result signal that is the output of the variable ring oscillator circuit.

16. The test circuit of claim 1 wherein the test circuit is formed adjacent to a die containing the integrated circuit.

17. The test circuit of claim 1 wherein the test circuit is formed on a die that contains the integrated circuit.

18. The test circuit of claim 1 wherein the test circuit is formed on a large percentage of dies on the wafer.

19. The test circuit of claim 1 wherein the test circuit is formed on dies near the edge of the wafer.

* * * * *

UNITED STATES PATENT AND TRADEMARK OFFICE
CERTIFICATE OF CORRECTION

PATENT NO.         : 7,183,788 B2
APPLICATION NO. : 10/788491
DATED                  : February 27, 2007
INVENTOR(S)       : Brian Moore It is certified that error appears in the above-identified patent and that said Letters Patent is hereby corrected as shown below:

1. In the detailed description of the invention, column 9, line 34, the number "03" has been changed to --D3--, so that the line reads "network of diodes D1, D2, D3, D4 and D5 and capacitors"

2. In the detailed description of the invention, column 10, line 18, the asterisk ($*$) is used as a sign of multiplication and is in the middle of the line and not superscript, so that the line reads "$n*t_{inv}$ seconds long. The clock signal 90 therefore has a"

3. In the detailed description of the invention, column 10, line 19, the asterisk ($*$) is used as a sign of multiplication and is in the middle of the line and not superscript, so that the line reads "frequency of $1/(2*n*\tau_{inv})$ Hz."

4. In the detailed description of the invention, column 10, line 64, the numbers "16" and "17" have been changed to --I6-- and --I7--, so that the line reads "inverters I6 and I7. The number of D flip-flops correlates"

5. In the detailed description of the invention, column 11, lines 23 and 24, the numbers "16" and "17" have been changed to --I6-- and --I7--, so that the lines read "for master reset and startup functionality (i.e. inverters I6 and I7) are included so that a new test can be started as fast"

6. In the detailed description of the invention, column 11, line 26, the numbers "16" and "17" have been changed to --I6-- and --I7--, so that the line reads "inverters I6 and I7 ensure that there is a good square edge"

7. In the detailed description of the invention, column 12, line 29, the asterisk ($*$) is used as a sign of multiplication and is in the middle of the line and not superscript, so that the line reads "$1/(2*3*\tau_{inv})$. However, if the load 134 on the second inverter"

8. In the detailed description of the invention, column 12, line 52, the asterisk ($*$) is used as a sign of multiplication and is in the middle of the line and not superscript, so that the line reads "(i.e. gate size). The time constant is therefore $k*R_{lump}*CL1$."

9. In the detailed description of the invention, column 12, line 54, the asterisk ($*$) is used as a sign of multiplication and is in the middle of the line and not superscript, so that the line reads "becomes $k*R_{lump}*(CL1+CL2)$ since the capacitors CL1 and"

UNITED STATES PATENT AND TRADEMARK OFFICE
CERTIFICATE OF CORRECTION

| | | |
|---|---|---|
| PATENT NO. | : 7,183,788 B2 | |
| APPLICATION NO. | : 10/788491 | |
| DATED | : February 27, 2007 | |
| INVENTOR(S) | : Brian Moore | |

It is certified that error appears in the above-identified patent and that said Letters Patent is hereby corrected as shown below:

10.    In the detailed description of the invention, column 12, line 58, the asterisk (∗) is used as a sign of multiplication and is in the middle of the line and not superscript, so that equation (2) reads "$f_{osc1}=1/(k*(R_{lump}*CL1))$"

11.    In the detailed description of the invention, column 12, line 60, the asterisk (∗) is used as a sign of multiplication and is in the middle of the line and not superscript, so that equation (3) reads "$f_{osc2}=1/(k*(R_{lump}*CL1+CL2))$"

12.    In the detailed description of the invention, column 13, lines 45 and 46, the numbers "114", "115" and "116" have been changed to --I14--, --I15-- and --I16--, so that the lines read "inverters I14, I15 and I16. In FIG. 18, the inverters I14, I15 and I16 appear disjoint from the variable ring oscillator 62,"

13.    In the detailed description of the invention, column 13, line 48, the numbers "114", "115" and "116" have been changed to --I14--, --I15-- and --I16--, so that the line reads "the variable ring oscillator 62, the inverters I14, I15 and I16"

14.    In the detailed description of the invention, column 13, lines 50 and 51, the numbers "114", "115" and "116" have been changed to --I14--, --I15-- and --I16--, so that the lines read "sequencer 60 and the outputs of the inverters I14, I15 and I16 are connected to the sub-circuits 152 and 162 at the"

15.    In the detailed description of the invention, column 14, line 60, the asterisk (∗) is used as a sign of multiplication and is in the middle of the line and not superscript, so that the line reads "ring oscillator 62 is $1/((2*5*)\tau_{inv})$ Hz where $\tau_{inv}$ is the delay"

16.    In the detailed description of the invention, column 15, line 10, the asterisk (∗) is used as a sign of multiplication and is in the middle of the line and not superscript, so that the line reads "oscillator 62 is $1/(k*(R_{lump}*C1))$ Hz (following the guide"

17.    In the detailed description of the invention, column 15, line 23, the asterisk (∗) is used as a sign of multiplication and is in the middle of the line and not superscript, so that the line reads "variable ring oscillator 62 is $1/(k*(R_{lump}*C2))$ Hz. The"

UNITED STATES PATENT AND TRADEMARK OFFICE
CERTIFICATE OF CORRECTION

| | | |
|---|---|---|
| PATENT NO. | : 7,183,788 B2 | Page 3 of 4 |
| APPLICATION NO. | : 10/788491 | |
| DATED | : February 27, 2007 | |
| INVENTOR(S) | : Brian Moore | |

It is certified that error appears in the above-identified patent and that said Letters Patent is hereby corrected as shown below:

18. In the detailed description of the invention, column 15, line 35, the asterisk (✻) is used as a sign of multiplication and is in the middle of the line and not superscript, so that equation (4) reads "$f_{osc1}=1/(k*(R_{lump}*CL1))$"

19. In the detailed description of the invention, column 15, line 36, the asterisk (✻) is used as a sign of multiplication and is in the middle of the line and not superscript, so that equation (5) reads "$f_{osc2}=1/(k*(R_{lump}*CL2))$"

20 In the detailed description of the invention, column 16 line 14, the asterisk (✻) is used as a sign of multiplication and is in the middle of the line and not superscript, so that the line reads "variable ring oscillator 62 is $1/(k*R1*C3)$ Hz (following the"

21. In the detailed description of the invention, column 16, lines 33 and 34, the asterisk (✻) is used as a sign of multiplication and is in the middle of the line and not superscript, so that the lines read "operation of the variable ring oscillator 62 is $1/(k*(R1+R2)*C4)$ Hz. Therefore, the frequency of oscillation is propor-"

22. In the detailed description of the invention, column 16, line 43, the asterisk (✻) is used as a sign of multiplication and is in the middle of the line and not superscript, so that equation (7) reads "$f_{osc1}=1/(k*(R1*CL3))$"

23. In the detailed description of the invention, column 16, line 45, the asterisk (✻) is used as a sign of multiplication and is in the middle of the line and not superscript, so that equation (8) reads "$f_{osc2}=1/(k*((R1+R2)*CL4))$"

24. In the detailed description of the invention, column 16, line 49, the asterisk (✻) is used as a sign of multiplication and is in the middle of the line and not superscript, so that equation (9) reads "$f_{osc1}/f_{osc2}=((R1+R2)/R1)*(CL4/CL3)$"

25 In the detailed description of the invention, column 17, line 2, the asterisk (✻) is used as a sign of multiplication and is in the middle of the line and not superscript, so that the line reads "$1/(7*\tau_{inv})$ Hz where $\tau_{inv}$ is the delay of one of the inverters."

UNITED STATES PATENT AND TRADEMARK OFFICE
CERTIFICATE OF CORRECTION

PATENT NO. : 7,183,788 B2
APPLICATION NO. : 10/788491
DATED : February 27, 2007
INVENTOR(S) : Brian Moore It is certified that error appears in the above-identified patent and that said Letters Patent is hereby corrected as shown below:

26. In the detailed description of the invention, column 17, line 9, the asterisk (∗) is used as a sign of multiplication and is in the middle of the line and not superscript, so that the line reads "oscillation period $\tau_5$ ($\tau_5 = 5 \ast \tau_{inv}$) when the variable ring"

27. In the detailed description of the invention, column 17, line 11, the asterisk (∗) is used as a sign of multiplication and is in the middle of the line and not superscript, so that the line reads "oscillation period $\tau_7$ ($\tau_7 = 7 \ast \tau_{inv}$) when the variable ring"

Signed and Sealed this

Twenty-fifth Day of March, 2008

JON W. DUDAS
*Director of the United States Patent and Trademark Office*